(12) United States Patent
Yamazaki et al.

(10) Patent No.: US 7,989,273 B2
(45) Date of Patent: Aug. 2, 2011

(54) SEMICONDUCTOR SUBSTRATE AND MANUFACTURING METHOD OF SEMICONDUCTOR DEVICE

(75) Inventors: Shunpei Yamazaki, Setagaya (JP); Mitsuhiro Ichijo, Zama (JP); Makoto Furuno, Atsugi (JP); Takashi Ohtsuki, Isehara (JP); Kenichi Okazaki, Tochigi (JP); Tetsuhiro Tanaka, Tochigi (JP); Seiji Yasumoto, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 412 days.

(21) Appl. No.: 12/155,052

(22) Filed: May 29, 2008

(65) Prior Publication Data

US 2008/0296724 A1    Dec. 4, 2008

(30) Foreign Application Priority Data

Jun. 1, 2007  (JP) .................................. 2007-147388

(51) Int. Cl.
 *H01L 21/336* (2006.01)
(52) U.S. Cl. ......... 438/149; 438/479; 438/164; 438/455
(58) Field of Classification Search .................. 438/149, 438/479, 164, 455
See application file for complete search history.

(56) References Cited

U.S. PATENT DOCUMENTS

| | | | |
|---|---|---|---|
| 6,365,933 B1 * | 4/2002 | Yamazaki et al. | 257/347 |
| 6,372,609 B1 | 4/2002 | Aga et al. | |
| 7,064,388 B2 * | 6/2006 | Hayakawa et al. | 257/347 |
| 7,154,147 B1 | 12/2006 | Yamazaki et al. | |
| 7,259,427 B2 * | 8/2007 | Yamazaki et al. | 257/347 |
| 7,767,542 B2 | 8/2010 | Ohnuma et al. | |
| 2002/0070454 A1 | 6/2002 | Yasukawa | |
| 2003/0020118 A1 * | 1/2003 | Kajiwara et al. | 257/347 |
| 2004/0178447 A1 | 9/2004 | Yeo et al. | |
| 2005/0227500 A1 | 10/2005 | Sugawara et al. | |
| 2005/0275024 A1 | 12/2005 | Yeo et al. | |
| 2006/0238132 A1 | 10/2006 | Kitamura et al. | |
| 2008/0246109 A1 | 10/2008 | Ohnuma et al. | |
| 2008/0248629 A1 | 10/2008 | Yamazaki | |
| 2008/0268263 A1 | 10/2008 | Yamazaki | |

FOREIGN PATENT DOCUMENTS

| | | |
|---|---|---|
| JP | 07-135208 | 5/1995 |
| JP | 11-163363 | 6/1999 |
| JP | 11-163363 A | 6/1999 |

OTHER PUBLICATIONS

European Search Report (Application No. 08009856.9) Dated Jun. 17, 2010.

* cited by examiner

*Primary Examiner* — Eugene Lee
(74) *Attorney, Agent, or Firm* — Eric J. Robinson; Robinson Intellectual Property Law Office, P.C.

(57) ABSTRACT

To provide a semiconductor substrate including a crystalline semiconductor layer which is suitable for practical use, even if a material different from that of the semiconductor layer is used for a supporting substrate, and a semiconductor device using the semiconductor substrate. The semiconductor substrate includes a bonding layer which forms a bonding plane, a barrier layer formed of an insulating material containing nitrogen, a relief layer which is formed of an insulating material that includes nitrogen at less than 20 at. % and hydrogen at 1 at. % to 20 at. %, and an insulating layer containing a halogen, between a supporting substrate and a single-crystal semiconductor layer. The semiconductor device includes the above-described structure at least partially, and a gate insulating layer formed by a microwave plasma CVD method using $SiH_4$ and $N_2O$ as source gases is in contact with the single-crystal semiconductor layer.

21 Claims, 22 Drawing Sheets

- ◆ gas ratio; $N_2O/SiH_4 = 200$, 30Pa
- ○ gas ratio; $N_2O/SiH_4 = 100$, 30Pa
- □ gas ratio; $N_2O/SiH_4 = 100$, 35Pa
- × gas ratio; $N_2O/SiH_4 = 100$, 40Pa

- ◆ gas ratio; N₂O/SiH₄ = 200, 30Pa
- ○ gas ratio; N₂O/SiH₄ = 100, 30Pa
- □ gas ratio; N₂O/SiH₄ = 100, 35Pa
- × gas ratio; N₂O/SiH₄ = 100, 40Pa

SEMICONDUCTOR SUBSTRATE AND MANUFACTURING METHOD OF SEMICONDUCTOR DEVICE

BACKGROUND OF THE INVENTION

1. Field of the Invention

The present invention relates to a silicon-on-insulator (SOI) structure formed using a bonding technique, and particularly relates to a manufacturing method of a semiconductor substrate in which a single-crystal semiconductor layer is bonded to a supporting substrate which has an insulating surface, such as a glass substrate or the like. Further, the present invention relates to display devices and semiconductor devices formed using a semiconductor substrate having such an SOI structure, and a manufacturing method thereof.

2. Description of the Related Art

Semiconductor substrates called silicon-on-insulator (SOI substrate), in each of which a thin single-crystal semiconductor layer is formed on an insulating layer, have been developed instead of silicon wafers manufactured by thinly slicing single-crystal semiconductor ingots. In an integrated circuit using a semiconductor substrate, parasitic capacitance of a transistor can be reduced. Thus, the integrated circuit using a semiconductor substrate is effective for speeding up operation and reducing electric power consumption. Therefore, an SOI substrate is applied to high-performance semiconductor devices such as a microprocessor.

As a method for manufacturing SOI substrates, a separation method using hydrogen ion implantation is known (e.g., see Reference 1: U.S. Pat. No. 6,372,609). The separation method using hydrogen ion implantation is a method in which hydrogen ions are implanted into a silicon wafer to form a microbubble layer at a predetermined depth from a surface, a silicon layer (SOI layer) is separated using the microbubble layer as a separation plane, and the SOI layer is bonded to another silicon wafer. In this method, in addition to heat treatment for separating the SOI layer, it is necessary to perform heat treatment in an oxidation atmosphere to form an oxide film on the SOI layer, remove the oxide film, and perform heat treatment at 1000° C. to 1300° C. in a reducing atmosphere, in order to increase bonding strength.

On the other hand, a semiconductor device in which a single-crystal silicon layer is provided over an insulating substrate such as a high heat-resistance glass is disclosed (Reference 2: Japanese Patent Published Application No. H11-163363). The semiconductor device has a structure where the entire surface of a crystallized glass having a strain point of 750° C. or higher is protected with an insulating silicon film, and a single-crystal silicon layer obtained by a separation method using hydrogen ion implantation is bonded firmly to the insulating silicon film.

SUMMARY OF THE INVENTION

In the case where a single-crystal semiconductor layer and a supporting substrate are bonded to each other with an insulating layer interposed therebetween, if a material of the supporting substrate is different from that of the single-crystal semiconductor layer, the supporting substrate and the single-crystal semiconductor layer are likely to be warped due to a difference in a physical property therebetween. This generates a defect in the single-crystal semiconductor layer in some cases, which causes degradation of characteristics of the semiconductor element.

In the case of manufacturing a semiconductor integrated circuit using a crystalline semiconductor layer provided over a glass substrate having a strain point of 700° C. or lower, an insulating layer having a high withstand voltage even at a temperature that is lower than or equal to the strain point is required.

The present invention has been made in view of the above problems. It is an object of the present invention to provide a semiconductor substrate including a crystalline semiconductor layer which is suitable for practical use, even if a material different from that of the semiconductor layer is used for a supporting substrate, and a manufacturing method thereof. Further, it is another object of the present invention to provide a semiconductor device using such a semiconductor substrate and a manufacturing method thereof.

The gist of one aspect of the present invention is a semiconductor substrate which includes a bonding layer which forms a bonding plane, a barrier layer formed of an insulating material containing nitrogen, a relief layer which is formed of an insulating material that includes nitrogen at a concentration of less than 20 at. % (preferably, 0.01 at. % to 10 at. %) and hydrogen (and/or an OH group) at a concentration of 1 at. % to 20 at. %, and an insulating layer containing a halogen, between a supporting substrate and a single-crystal semiconductor layer.

The gist of one aspect of the present invention is a semiconductor device which includes the above-described structure at least partially and in which an insulating layer (typically a gate insulating layer) formed by a microwave plasma CVD method is in contact with a single-crystal semiconductor layer. The insulating layer is preferably formed of silicon oxynitride, and the silicon oxynitride contains more oxygen than nitrogen and preferably includes oxygen, nitrogen, silicon, and hydrogen (and/or an OH group) at concentrations ranging from 55 at. % to 65 at. %, 1 at. % to 20 at. %, 25 at. % to 35 at. %, and 0.1 at. % to 10 at. %, respectively.

By providing a plurality of insulating layers having different functions between a supporting substrate and a single-crystal semiconductor layer, the supporting substrate and the single-crystal semiconductor layer formed of different materials are bonded. Furthermore, the single-crystal semiconductor layer can be prevented from being contaminated with impurities, and generation of crystal defects caused by application of strain stress can be suppressed. When the relief layer includes nitrogen at a concentration of 20 at. % or less and hydrogen (and/or an OH group) at a concentration of 0.1 at. % to 10 at. % to have structural flexibility, stress warping generated in the case where different materials are made in close contact with each other can be relieved efficiently. An insulating layer containing a halogen can capture metal impurities and prevent a single-crystal semiconductor layer from being contaminated.

When an insulating layer formed by a microwave plasma CVD method is used as an insulating layer (particularly, a gate insulating layer) of a semiconductor integrated circuit, the withstand voltage can be improved. Further, gate leakage can be reduced, and a semiconductor device having excellent hot carrier resistance can be provided.

DETAILED DESCRIPTION OF THE INVENTION

Figure 1A:
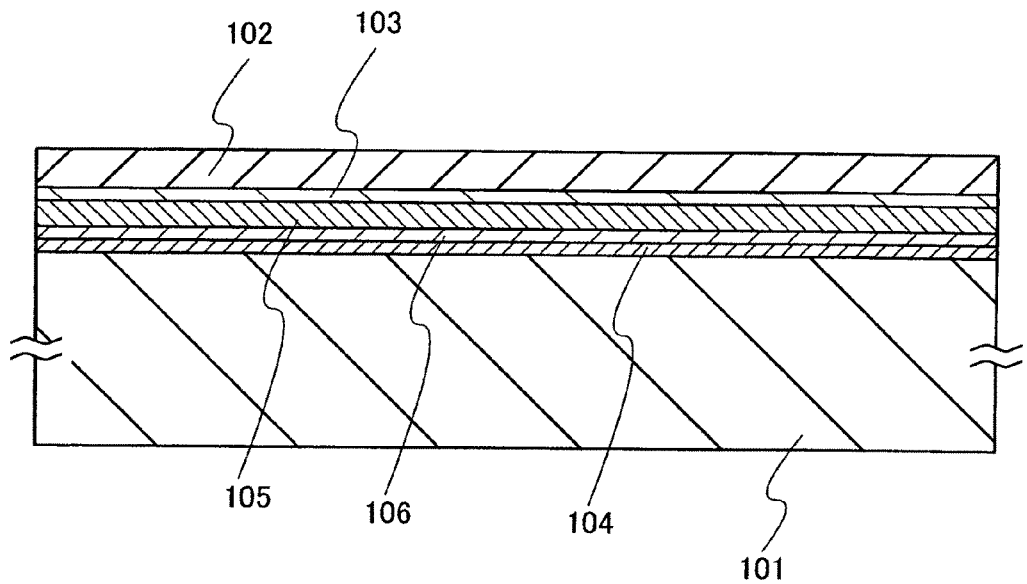
FIGS. 1A and 1B are cross-sectional views of structures of a semiconductor substrate according to the present invention.

Embodiment Mode of the present invention will be described below with reference to the drawings. It is easily understood by those skilled in the art that various changes may be made in forms and details without departing from the spirit and the scope of the invention. Therefore, the present invention should not be interpreted as being limited to the descriptions of the embodiment mode below. In structures of the present invention described below, the same reference numerals are commonly given to the same components or components having similar functions throughout the drawings.

The cases where a single-crystal semiconductor layer is provided over a substrate having an insulating surface or an insulating substrate are described below; however, if a different kind of semiconductor substrate is used as a parent body of the semiconductor layer, a polycrystalline semiconductor layer can also be bonded to a substrate having an insulating surface or an insulating substrate.

Modes of a semiconductor substrate according to this embodiment mode will be described with reference to FIGS. 1A and 1B and 2A and 2B. In each of the drawings, as a supporting substrate 101, a substrate having an insulating surface, specifically, a glass substrate used for electronics industry (also called a "non-alkali glass substrate") such as an aluminosilicate glass substrate, an aluminoborosilicate glass substrate, or a barium borosilicate glass substrate can be used. In other words, a glass substrate having a coefficient of thermal expansion of $25 \times 10^{-7}/°C$ to $50 \times 10^{-7}/°C$ (preferably, $30 \times 10^{-7}/°C$ to $40 \times 10^{-7}/°C$) and a strain point of 580° C. to 680° C. (preferably, 600° C. to 680° C.) can be used. Alternatively, a quartz substrate, a ceramic substrate, a metal substrate having a surface coated with an insulating film, or the like can be used.

A single-crystal semiconductor layer 102 is obtained by being separated from a single-crystal semiconductor substrate. For example, the single-crystal semiconductor layer 102 is obtained in such a manner that hydrogen or fluorine ions are introduced into a predetermined depth of a single-crystal semiconductor substrate, and heat treatment is performed to separate a single-crystal semiconductor layer, which is a surface layer. As the single-crystal semiconductor substrate, a substrate of silicon, germanium, or the like, or a substrate made of a compound semiconductor such as gallium arsenide or indium phosphide can be used. Alternatively, a method in which single-crystal silicon is epitaxially grown on a porous silicon layer and the porous silicon layer is cleaved by water jetting so as to cause separation may also be applied. The thickness of the single-crystal semiconductor layer 102 is 5 nm to 500 nm, and preferably 10 nm to 200 nm.

In FIG. 1A, an insulating layer 103 including a halogen is provided in contact with the single-crystal semiconductor layer 102. A typical example of the insulating layer 103 including a halogen is a silicon oxide layer including a halogen. This silicon oxide layer is formed by oxidizing the surface of a single-crystal semiconductor substrate which is a parent body of the single-crystal semiconductor layer 102. By including a halogen, the insulating layer 103 including a halogen can reduce the local level density at the interface between the single-crystal semiconductor layer 102 and the insulating layer 103 including a halogen. In other words, the interface between the single-crystal semiconductor layer 102 and the insulating layer 103 including a halogen is inactivated, so that electric characteristics become stable. Therefore, the single-crystal semiconductor layer 102 and the insulating layer 103 including a halogen are preferably provided in contact with each other.

A relief layer 105 formed of an insulating material which includes nitrogen at a concentration of less than 20 at. % (preferably, 0.01 at. % to 10 at. %) and hydrogen (and/or an OH group) at a concentration of 1 at. % to 20 at. % is provided in contact with the insulating layer 103 including a halogen. The relief layer 105 is formed using a single layer selected from a silicon oxide layer or a silicon oxynitride layer or a stacked structure including plural layers of the above layers. When the relief layer 105 includes nitrogen at a concentration of less than 20 at. % and hydrogen (and/or an OH group) at a concentration of 1 at. % to 20 at. % to have flexibility, stress warping generated in the case where different materials are made in contact with each other can be relieved efficiently. The relief layer 105 is preferably provided to have a thickness of from 10 nm to 5000 nm, and more preferably of from 30 nm to 1000 nm.

A barrier layer 106 formed using an insulating material containing nitrogen is formed using a single layer selected from a silicon nitride layer, a silicon nitride oxide layer, an aluminum nitride layer, or an aluminum nitride oxide layer or a stacked structure including plural layers of the above layers. It is preferable to provide the barrier layer 106 in order to prevent impurities from diffusing into the single-crystal semiconductor layer 102 side.

A silicon oxynitride layer means a layer that contains more oxygen than nitrogen and includes oxygen, nitrogen, silicon, and hydrogen (and/or an OH group) at concentrations ranging from 55 at. % to 65 at. %, 1 at. % to 20 at. %, 25 at. % to 35 at. %, and 0.1 at. % to 10 at. %, respectively. Further, a silicon nitride oxide layer means a layer that contains more nitrogen than oxygen and includes oxygen, nitrogen, silicon, and hydrogen (and/or an OH group) at concentrations ranging from 15 at. % to 30 at. %, 20 at. % to 35 at. %, 25 at. % to 35 at. %, and 15 at. % to 25 at. %, respectively.

A bonding layer 104 to serve as a bonding plane is provided between the barrier layer 106 and the supporting substrate 101. With the bonding layer 104, the single-crystal semiconductor layer 102 and the supporting substrate 101 are bonded. Not that it is not necessary to provide the single-crystal semiconductor layer 102 and the bonding layer 104 in contact with each other and to provide the supporting substrate 101 and the bonding layer 104 in contact with each other. The bonding layer 104 has a smooth and hydrophilic surface. As the layer having a surface like this, an insulating layer formed by a chemical reaction is preferable. For example, an oxide film which is formed by a thermal reaction or a chemical reaction is suitable. A film formed by a chemical reaction is preferable because the smoothness of the surface can be secured. The bonding layer 104 which has a smooth and hydrophilic surface is provided with a thickness of from 0.2 nm to 500 nm. With this thickness, it is possible to smooth surface roughness of a film on which a bonding layer is to be formed and also to secure smoothness of a surface of the bonding layer itself.

As a preferable example of the bonding layer 104, silicon oxide which is deposited by a chemical vapor deposition method can be used. In this case, a silicon oxide film formed using an organic silane gas by a chemical vapor deposition method is preferably used. As the organic silane gas, a silicon-containing compound such as tetraethoxysilane (TEOS: chemical formula, $Si(OC_2H_5)_4$), tetramethylsilane (TMS: chemical formula, $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used. The bonding layer 104 may be formed only on the supporting substrate 101 side and may be bonded to a layer having the single-crystal semiconductor layer 102. Alternatively, the bonding layer 104 may be formed on both the supporting substrate 101 side and the side of a layer having the single-crystal semiconductor layer 102 and then may be bonded to each other.

The bonding layer 104 is provided between the barrier layer 106 and the supporting substrate 101, and these layers are formed in close contact with each other. In this way, bonding can be achieved even at a room temperature. When the supporting substrate 101 and the single-crystal semiconductor layer 102 are pressed, that is, when pressure is applied thereto, the bonding can be made stronger. Since this bonding is formed by attractive force between the surfaces, a more preferred mode can be obtained by adding treatment in which a plurality of hydrophilic groups are attached to the surface. For example, it is preferable that the surface of the bonding layer 104 be subjected to oxygen plasma treatment or ozone treatment to have a hydrophilic property. In the case where the bonding layer 104 is formed on the single-crystal semiconductor layer 102 side, the surface of the supporting substrate 101 is preferably subjected to oxygen plasma treatment or ozone treatment to have a hydrophilic property. In the case where the surface is subjected to the treatment to have a hydrophilic property in this manner, hydroxyl group (OH group) on the surface acts to form a bond due to hydrogen bonding.

Further, as the treatment in which a plurality of hydrophilic groups are attached to the surface, a cleaning step can be given. When the cleaned surfaces are made in close contact with each other, a bond can be easily formed. Further, when the bonded surfaces are subjected to heat treatment at a room temperature or higher, the bond can be strengthened. For example, as a cleaning treatment of the bonding layer 104 and/or a layer to be in contact with the bonding layer 104, it is effective that the surface(s) of the bonding layer 104 and/or the layer to be in contact with the bonding layer 104 is/are irradiated with an ion beam using an inert gas such as argon. By the ion beam irradiation, dangling bonds are exposed on the surface of the bonding layer 104 and/or the surface of the layer to be in contact with the bonding layer 104, and the surface(s) becomes very active. When the surfaces which are activated in the above-described manner are made in close contact with each other, a bond can be formed even at a low temperature. In the bonding method in which a surface is activated, it is required to keep the surface in a highly clean state; accordingly, the method is preferably carried out in vacuum.

Figure 1B:
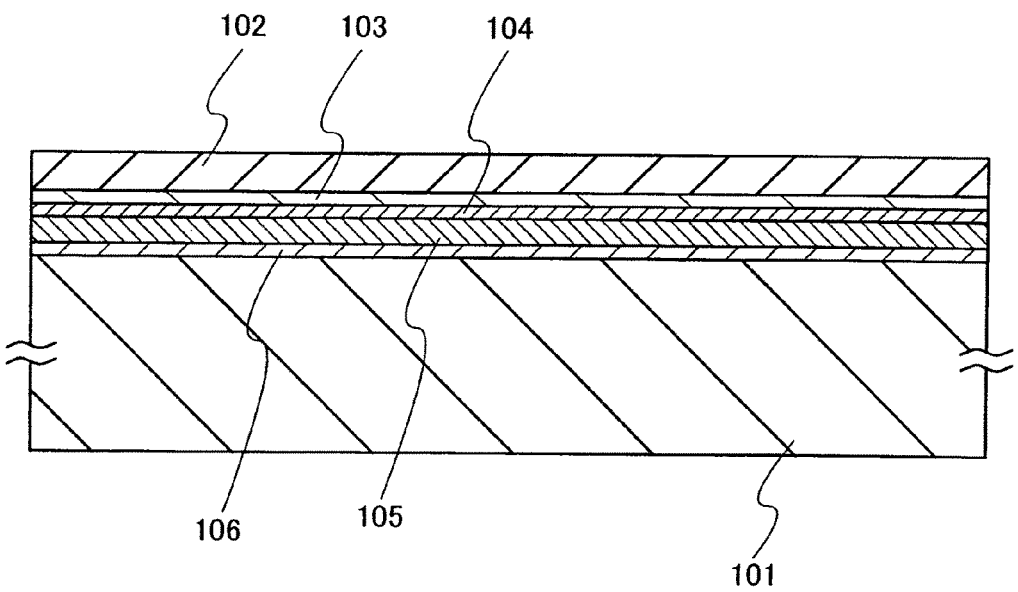

FIG. 1B shows a structure where the barrier layer 106, the relief layer 105, and the bonding layer 104 are provided in this order from the supporting substrate 101, side and the single-crystal semiconductor layer 102 which is in contact with the insulating layer 103 including a halogen is bonded thereto. A glass substrate used in the electronics industry such as an aluminosilicate glass substrate, an aluminoborosilicate glass substrate, or a barium borosilicate glass substrate (they are also called "non-alkali glass substrates"), which is used as the supporting substrate 101, contains a small amount of an alkali metal such as sodium. This small amount of impurities adversely affects characteristics of a semiconductor element such as a transistor. The barrier layer 106 is provided because it can prevent the metal impurities as described above contained in the supporting substrate 101 from diffusing to the single-crystal semiconductor layer 102 side. Further, the relief layer 105 has an effect of relieving internal stress of the barrier layer 106.

The bonding layer 104 having a smooth and hydrophilic surface is provided between the insulating layer 103 including a halogen and the relief layer 105. As a preferable example of the bonding layer 104, silicon oxide deposited by a chemical vapor deposition method can be used. The bonding layer 104 is interposed between the insulating layer 103 including a halogen and the relief layer 105, and the layers are in close contact with each other, so that a bond can be formed even at a room temperature. Further, by pressing the supporting substrate 101 and the single-crystal semiconductor layer 102, that is, by applying pressure, bonding can be made stronger. The principle of bonding formation by the bonding layer 104 is similar to that in FIG. 1A.

Figure 2A:
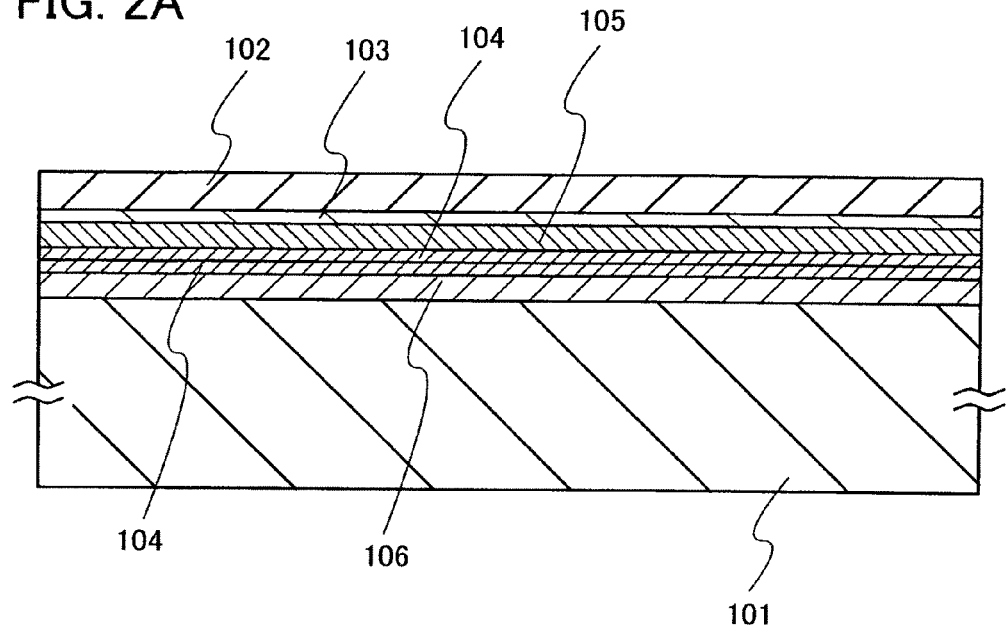
FIGS. 2A and 2B are cross-sectional views of structures of a semiconductor substrate according to the present invention.

FIG. 2A shows a structure where the relief layer 105 is provided between the bonding layer 104 and the insulating layer 103 including a halogen which is in contact with the single-crystal semiconductor layer 102, and the barrier layer 106 is provided between the supporting substrate 101 and the bonding layer 104. In other words, it is a structure where the barrier layer 106, the bonding layer 104, the relief layer 105, the insulating layer 103 including a halogen, and the single-crystal semiconductor layer 102 are provided in this order from the supporting substrate 101 side. The bonding layer 104 is provided for both the single-crystal semiconductor layer side and the supporting substrate side. The bonding layers 104 are in contact with each other, so that the single-crystal semiconductor layer 102 and the supporting substrate 101 are bonded. When the relief layer 105 is provided close to the single-crystal semiconductor layer 102, the relief layer 105 can efficiently relieve stress warping of the single-crystal semiconductor layer 102. Further, when the barrier layer 106 is provided close to the supporting substrate 101, the barrier layer 106 can efficiently prevent contamination with impurities from the supporting substrate 101 side. The barrier layer 106 may be formed using one or a plurality of layers selected from a silicon nitride layer, a silicon nitride oxide layer, an aluminum nitride layer, or an aluminum nitride oxide layer.

Figure 2B:
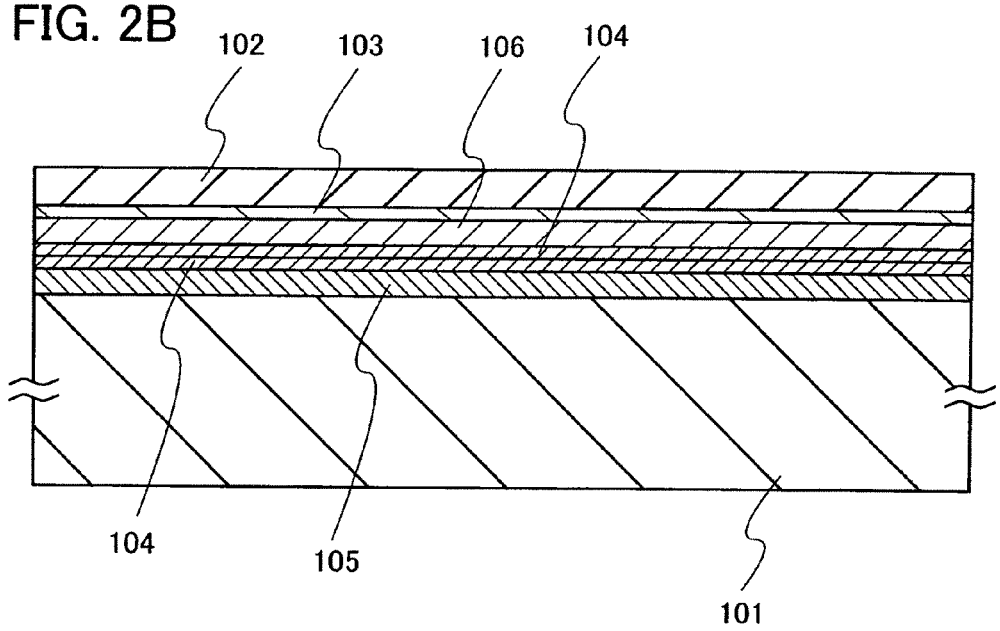

FIG. 2B shows a structure where the barrier layer 106 is provided between the bonding layer 104 and the insulating layer 103 including a halogen which is in contact with the single-crystal semiconductor layer 102, and the relief layer 105 is provided between the supporting substrate 101 and the bonding layer 104. In other words, it is a structure where the relief layer 105, the bonding layer 104, the barrier layer 106, the insulating layer 103 including a halogen, and the single-crystal semiconductor layer 102 are provided in this order from the supporting substrate 101 side. The bonding layer 104 is provided for both the single-crystal semiconductor layer side and the supporting substrate side. These bonding layers 104 are in close contact with each other, so that the single-crystal semiconductor layer 102 and the supporting substrate 101 are bonded. When the relief layer 105 is provided close to the supporting substrate 101, the relief layer 105 can efficiently relieve heat distortion of the supporting substrate 101. In this case, since the relief layer 105 can be formed thick and in contact with the supporting substrate 101, the relief layer 105 can relieve minute roughness (e.g., polished trace or the like) on the surface of the supporting substrate 101, thereby improving planarity. Further, by providing the barrier layer 106 close to the single-crystal semiconductor layer 102, contamination with impurities can be efficiently prevented.

For one or both of the bonding layers 104, a silicon oxynitride film formed using a nitrogen oxide gas, and a silicon hydride gas or a silicon fluoride gas (typically, $N_2O$ and $SiH_4$) may be used instead of a silicon oxide film formed using an organic silane gas by a plasma chemical vapor deposition (CVD) method. In this case, at least one of the bonding layer 104 provided on the single-crystal semiconductor layer 102 side and the bonding layer 104 provided on the supporting substrate 101 side may be a silicon oxide film formed using an organic silane gas by a plasma CVD method, and the other may be a silicon oxynitride film. Alternatively, both of the bonding layers 104 may be formed using a silicon oxynitride film.

By the structures of FIGS. 1A to 2B, the single-crystal semiconductor layer 102 can be prevented from being contaminated with impurities, and generation of crystal defects caused by application of strain stress can be suppressed. Further, the local level density at the interface between the single-crystal semiconductor layer 102 and the insulating layer including a halogen can be reduced. Using such a single-crystal semiconductor layer 102, a semiconductor element such as a transistor can be manufactured.

Figure 3A:
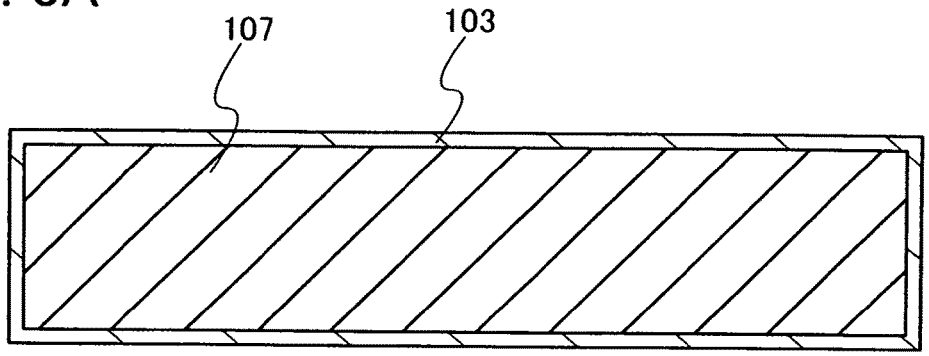
FIGS. 3A to 3C are cross-sectional views of a manufacturing method of a semiconductor substrate according to the present invention.

Next, a manufacturing method of such a semiconductor substrate will be described with reference to the drawings. In FIG. 3A, as a single-crystal semiconductor substrate 107, a p-type or an n-type single-crystal silicon substrate (silicon wafer) is used. After removing an oxide film on the surface of the single-crystal semiconductor substrate 107, the insulating layer 103 including a halogen is formed. Degreasing washing can be employed for the removal of the oxide film. For formation of the insulating layer 103 including a halogen, it is preferable to perform heat treatment in an oxygen atmosphere into which a halogen is added. For example, heat treatment is performed at a temperature of 700° C. or higher in an atmosphere containing HCl at 0.5 to 10 volume % (preferably 3 volume %) with respect to oxygen. The heat treatment is preferably performed at a temperature of from 950° C. to 1150° C. The treatment time may be 0.1 to 6 hours, preferably 0.5 to 1 hour. As the halogen to be added, one or more substances selected from HF, $NF_3$, HBr, $Cl_2$, $ClF_3$, $BCl_3$, $F_2$, $Br_2$, or the like as well as HCl can be used. The film thickness of the insulating layer 103 including a halogen is 10 nm to 1000 nm (preferably 50 nm to 200 nm) and, for example, 100 nm. The concentration of the halogen in the insulating layer 103 including a halogen is $1\times10^{17}/cm^3$ to $5\times10^{20}/cm^3$, and the insulating layer 103 including a halogen can capture impurities such as metal and prevent the single-crystal semiconductor substrate 107 from being contaminated.

By forming the insulating layer 103 including a halogen within such a temperature range, a gettering effect by a halogen element can be obtained. Gettering has an effect of removing a metal impurity, in particular. In other words, by an operation of the halogen typified by chlorine, an impurity such as metal turns into a volatile halide, for example, chloride, moves into the air, and is removed. Gettering is particularly effective if the surface of the single-crystal semiconductor substrate 107 is subjected to chemical mechanical polishing (CMP). In addition, hydrogen has an operation of compensating defects in an interface between the single-crystal semiconductor substrate 107 and the insulating layer 103 including a halogen so as to reduce a local level density at the interface.

Figure 3B:
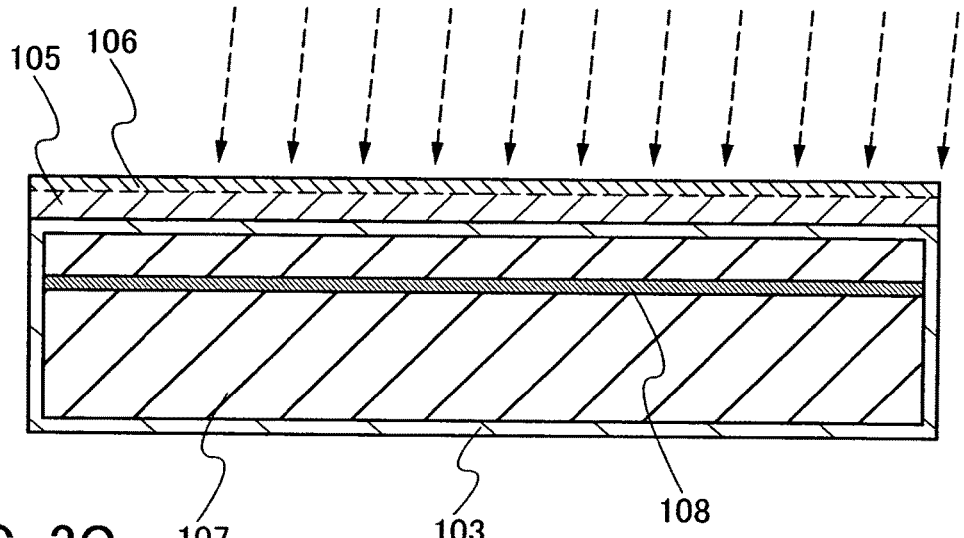

In FIG. 3B, the relief layer 105 is formed in contact with the insulating layer 103 including a halogen. The relief layer 105 is preferably formed using a silicon oxide film or a silicon oxynitride film by a plasma CVD method. The relief layer 105 is formed with a thickness of from 10 nm to 5000 nm, and preferably from 30 nm to 1000 nm. In the case of forming a silicon oxynitride film, a nitrogen oxide gas, and a silicon hydride gas or a silicon fluoride gas (typically, $N_2O$ and $SiH_4$) may be used as a source gas, and the silicon oxynitride film is preferably deposited at a temperature of 500° C. or lower so as to include nitrogen at a concentration of less than 20 at. % (preferably, 0.01 at. % to 10 at. %) and hydrogen (and/or an OH group) at a concentration of 1 at. % to 20 at. %.

After formation of the relief layer 105, the barrier layer 106 is formed. It is preferable that the relief layer 105 and the barrier layer 106 be formed successively. As the barrier layer 106, a silicon nitride layer or a silicon nitride oxide layer is formed with a thickness of from 50 nm to 200 nm by a vapor deposition method. For example, the silicon nitride film is formed using $SiH_4$ and $NH_3$ as a source gas by a plasma CVD method. The silicon nitride oxide layer is formed using $SiH_4$, $N_2O$, and $NH_3$ by a plasma CVD method. The barrier layer 106 has an effect of preventing impurity diffusion, and in formation of a separation layer 108, the barrier layer 106 can also prevent the surface of the single-crystal semiconductor substrate 107 from being damaged by ion irradiation and from losing its planarity.

After formation of the barrier layer 106 and the relief layer 105, the separation layer 108 is formed by introducing hydrogen ions or halogen ions. The separation layer 108 is formed by introducing ions accelerated by an electric field from the surface of the single-crystal semiconductor substrate 107 into a predetermined depth. The depth of the separation layer 108 formed in the single-crystal semiconductor substrate 107 is approximately 5 nm to 500 nm, and preferably 10 nm to 100 nm. The depth of the separation layer 108 in the single-crystal semiconductor substrate 107 can be controlled by the acceleration energy of ions and the incident angle of the ions, and can also be controlled by the thickness of the barrier layer 106 and the relief layer 105. In this case, since the relief layer 105 mainly contains silicon oxide or silicon oxynitride, internal stress can be lowered; accordingly, the relief layer 105 can be formed relatively thick. In other words, the depth of ions introduced to form the separation layer 108 may be controlled by the thickness of the relief layer 105.

The separation layer 108 is formed in a region at a specific depth (the depth that is close to the mean penetration depth of ions) from the surface of the single-crystal semiconductor substrate 107. For example, the thickness of the single-crystal semiconductor layer is from 5 nm to 500 nm, and preferably from 10 nm to 200 nm. The accelerating voltage in ion introduction is determined in consideration of the thickness of the barrier layer 106 and the relief layer 105. The ion introduction is preferably conducted with an ion doping apparatus. In other words, a doping method in which plural ion species generated by making a source gas into plasma are not mass-separated and introduced, is preferably used. In this embodiment mode, it is preferable to introduce a single type of ions or plural types of ions of the same atom which have different masses (e.g., $H^+$, $H_2^+$, and $H_3^+$ ions). At the ion doping, the accelerating voltage may be 10 kV to 100 kV, and preferably 30 kV to 80 kV; the dose may be $1 \times 10^{16}/cm^2$ to $4 \times 10^6/cm^2$; and the beam current density may be equal to or grater than $2$ $\mu A/cm^2$, preferably equal to or greater than $5$ $\mu A/cm^2$, and more preferably equal to or greater than $10$ $\mu A/cm^2$. By this introduction, defect generated in the semiconductor layer can be reduced.

In the case of introduction of hydrogen ions, it is preferable that $H^+$, $H_2^+$, and $H_3^+$ ions be contained and the percentage of $H_3^+$ ions be made higher than those of $H^+$ and $H_2^+$ ions because introduction efficiency can be increased and the time for ion introduction can be shortened. Accordingly, the region of the separation layer 108 formed in the single-crystal semiconductor substrate 107 can contain hydrogen at a concentration equal to or higher than $1 \times 10^{20}/cm^3$ (preferably, $5 \times 10^{20}/cm^3$). When a region into which hydrogen is introduced at a high concentration is locally formed in the single-crystal semiconductor substrate 107, the crystal structure is disordered and minute voids are formed, so that the separation layer 108 having a porous structure can be obtained. In this case, the volume of the minute voids formed in the separation layer 108 is changed by heat treatment at a relatively low temperature, and separation (cleavage) occurs along the separation layer 108; accordingly, a thin single-crystal semiconductor layer can be separated and obtained.

Even when the ions are mass-separated and introduced into the single-crystal semiconductor substrate 107, the separation layer 108 can be formed similarly. In this case also, it is preferable that ions having a large mass (e.g., $H_3^+$ ions) be selected to irradiate the single-crystal semiconductor substrate 107 because the effect similar to the effect mentioned above can be achieved.

Other than hydrogen, deuterium or an inert gas such as helium can also be selected as the gas from which ions are generated. When helium is used as a source gas and an ion doping apparatus which does not have a mass-separation function is used, an ion beam with a high percentage of $He^+$ ions can be obtained. By introducing such ions into the single-crystal semiconductor substrate 107, minute voids can be formed and the separation layer 108 similar to the above can be provided in the single-crystal semiconductor substrate 107.

Figure 3C:
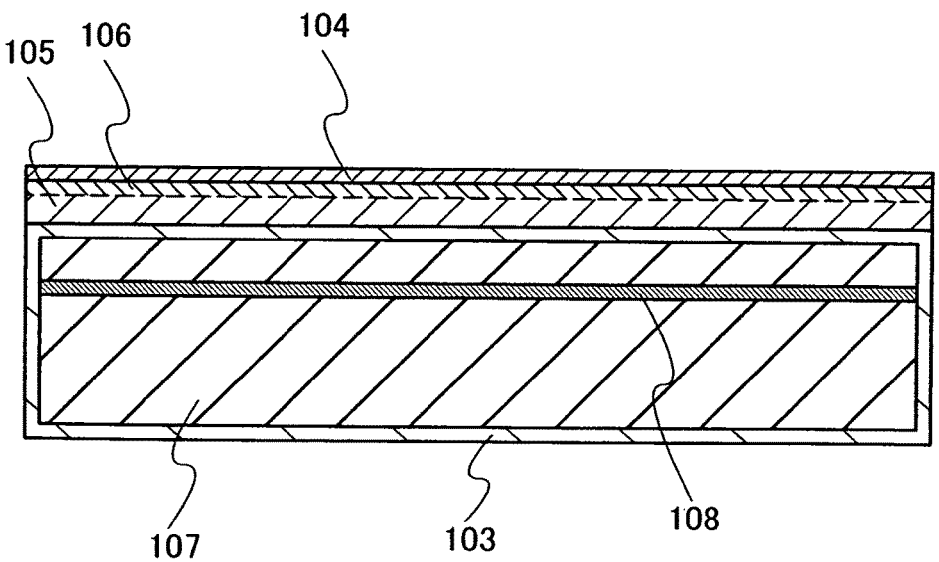

As shown in FIG. 3C, the bonding layer 104 is formed. A silicon oxide film is preferably formed as the bonding layer 104. The thickness of the silicon oxide film may be set at 10 nm to 200 nm, preferably 10 nm to 100 nm, and more preferably 20 nm to 50 nm. As the silicon oxide film, a silicon oxide film formed by a chemical vapor deposition method using an organic silane gas is preferable. As the organic silane gas, a silicon-containing compound such as tetraethoxysilane (TEOS: chemical formula, $Si(OC_2H_5)_4$), tetramethylsilane (TMS: chemical formula, $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used. Further, a silicon oxide film formed by a chemical vapor deposition method using a silane gas can also be applied.

In deposition by a chemical vapor deposition method, film formation is performed at a temperature, for example, 350° C. or lower, at which degassing of the separation layer 108 that is formed in the single-crystal semiconductor substrate is not caused. In addition, heat treatment for separating a single-crystal semiconductor layer from a single-crystal semiconductor substrate is performed at a temperature higher than the temperature at which the bonding layer 104 is formed.

In addition, in the steps of FIGS. 3B and 3C, after forming the separation layer 108, the relief layer 105, the barrier layer 106, and the bonding layer 104 may be formed sequentially. In this case, the relief layer 105, the barrier layer 106, and the bonding layer 104 can be formed without being exposed to the air, so that contamination due to foreign matters, potassium, sodium, or the like can be prevented.

Figure 4A:
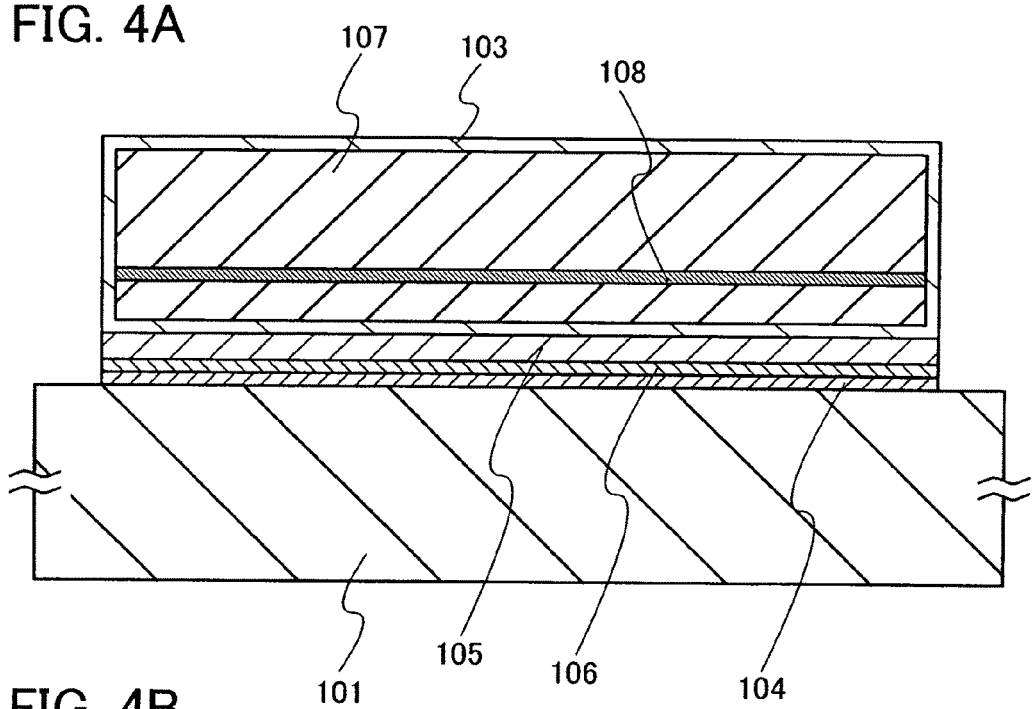
FIGS. 4A and 4B are cross-sectional views of a manufacturing method of a semiconductor substrate according to the present invention.

FIG. 4A shows a stage in which the supporting substrate 101 is made in close contact with the single-crystal semiconductor substrate 107. The supporting substrate 101 and a surface of the bonding layer 104 provided on the single-crystal semiconductor substrate 107 side, face each other and are made in close contact with each other, so that they are bonded. It is preferable that a surface which the supporting substrate or the bonding layer is to be in close contact with be cleaned sufficiently. By locating the supporting substrate 101 in close contact with the bonding layer 104, the bond can be formed therebetween. By pressing the supporting substrate 101 and the single-crystal semiconductor substrate 107 against each other, a stronger bond can be formed by hydrogen bonding. It can be considered that Van der Waals forces act at the initial stage of bonding.

In order to form a favorable bond, the surface(s) of the bonding layer 104 and/or the supporting substrate 101 may be activated. For example, the bonding plane of the bonding layer 104 and the supporting substrate 101 is subjected to surface treatment. For example, as the surface treatment, the surface is irradiated with an atomic beam or an ion beam. When an atomic beam or an ion beam is used, a neutral atom beam which is an inert gas such as argon or an ion beam which is an inert gas can be used. Alternatively, plasma irradiation or radical treatment is performed. Such a surface treatment can increase bonding strength even at a temperature of from 200° C. to 400° C.

Figure 4B:
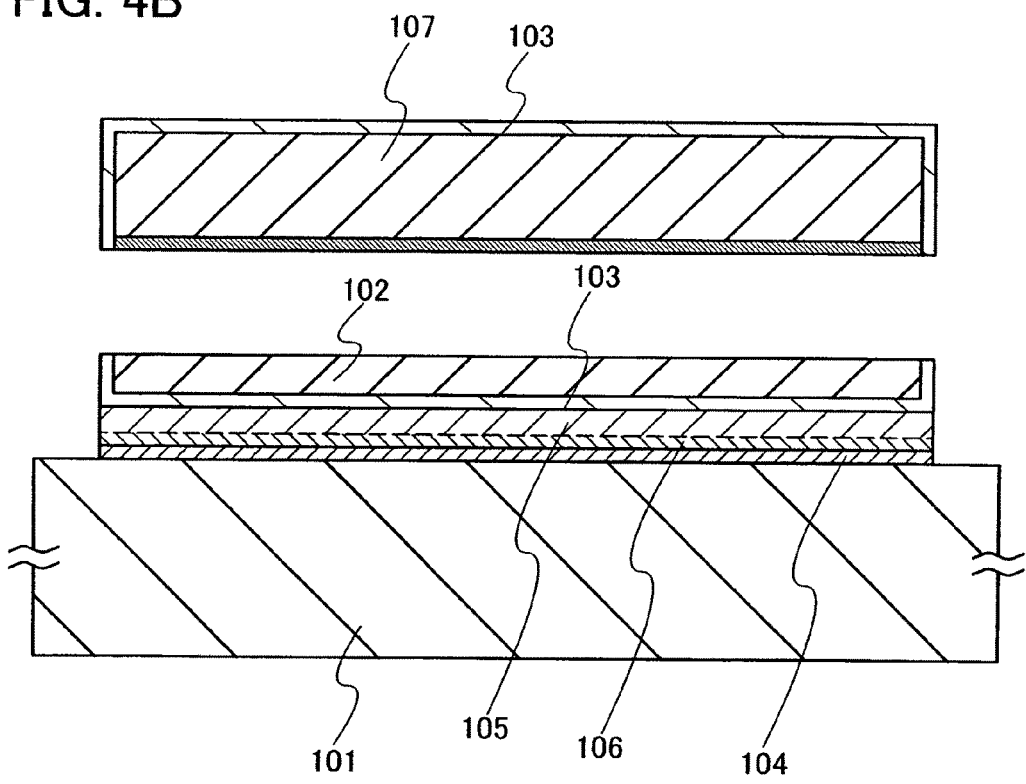

FIG. 4B shows a stage in which the single-crystal semiconductor layer 102 is separated from the single-crystal semiconductor substrate 107. Heat treatment is conducted with the single-crystal semiconductor substrate 107 and the supporting substrate 101 superposed on each other. By the heat treatment, the single-crystal semiconductor substrate 107 is separated with the single-crystal semiconductor layer 102 left over the supporting substrate 101. The heat treatment is preferably conducted at a temperature higher than or equal to the formation temperature of the bonding layer 104, that is, higher than or equal to 400° C. and lower than 600° C. By conducting the heat treatment at a temperature within the above-mentioned range, the volume of minute voids formed in the separation layer 108 is changed, so that separation can be conducted along the separation layer 108. Since the bonding layer 104 is bonded to the supporting substrate 101, the single-crystal semiconductor layer 102 having the same crystallinity as the single-crystal semiconductor substrate 107 is bonded to the supporting substrate 101.

Figure 5A:
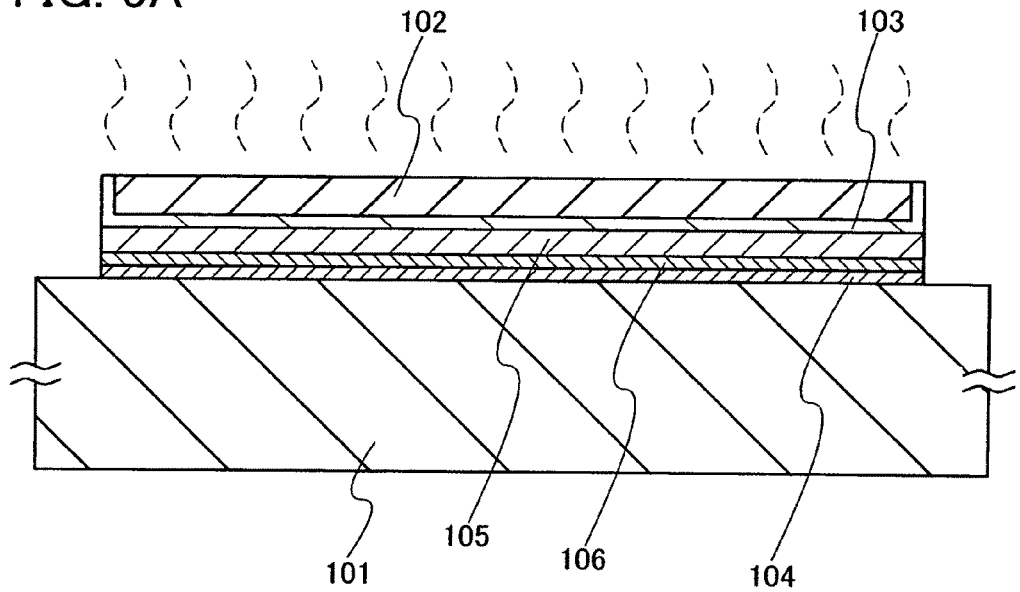
FIGS. 5A and 5B are cross-sectional views of a manufacturing method of a semiconductor substrate according to the present invention.

FIG. 5A shows a stage in which heat treatment is conducted while the single-crystal semiconductor layer 102 is bonded to the supporting substrate 101. By this heat treatment, hydrogen ions or halogen ions introduced to form the separation layer 108 can be removed from the single-crystal semiconductor layer 102. Further, heat treatment can be conducted in order to remove minute voids in the bonding portion between the supporting substrate 101 and the single-crystal semiconductor layer 102, that is, in the vicinity of the bonding layer 104. The temperature of the heat treatment is higher than or equal to a temperature at which hydrogen or a halogen is released from the single-crystal semiconductor layer 102, and up to a temperature in the vicinity of a strain point of the supporting substrate 101. For example, the heat treatment is performed at a temperature of from 400° C. to 730° C. As a heat treatment apparatus, an electrically-heated oven, a lamp annealing furnace, or the like can be applied. The heat treatment may be performed by changing the temperature at multiple steps. Alternatively, a rapid thermal annealing (RTA) apparatus may be used. In the case of performing heat treatment with the RTA apparatus, the heat treatment can be conducted at a temperature close to the strain point of the supporting substrate or a temperature slightly higher than the strain point. A hydrogen bonding between the supporting substrate 101 and the single-crystal semiconductor layer 102 can be changed into a stronger covalent bond by performing such heat treatment.

There is a case where excessive hydrogen contained in the single-crystal semiconductor layer 102 exhibits a complicate behavior and operates to deteriorate characteristics of a semiconductor element by using heat. For example, hydrogen contained between lattices of silicon operates to inactivate an impurity element that is used in doping for controlling value electrons. Accordingly, a threshold voltage of a transistor which is a semiconductor element varies and thus a source or drain region is made to have high resistance. When hydrogen is contained in lattices of silicon, there is a case that the coordination number of silicon varies and lattice defects are generated. Needless to say, hydrogen or a halogen has an operation of compensating a dangling bond in silicon, that is, repairing the defects. However, since hydrogen or a halogen which is introduced to form the separation layer 108 may deteriorate characteristics of a semiconductor element as described above, it is preferably once removed from the single-crystal semiconductor layer 102.

Figure 5B:
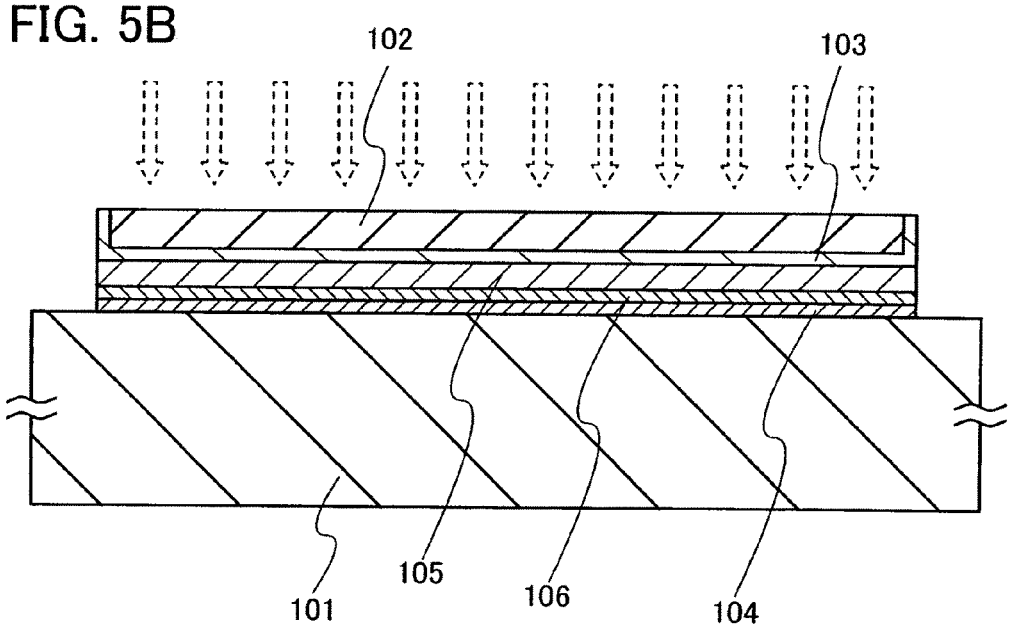

FIG. 5B shows a stage in which crystal defects are repaired by irradiation of the single-crystal semiconductor layer 102 with an energy beam. In this step, when the single-crystal semiconductor layer 102 is bonded to and/or separated from the supporting substrate 101, the single-crystal semiconductor layer 102 is thermally and/or mechanically damaged so that the crystallinity of the single-crystal semiconductor layer 102 is lowered. Thus, irradiation with an energy beam is preferably conducted to repair the damages. The energy beam is preferably a beam that is selectively absorbed by the single-crystal semiconductor layer 102, and a laser beam is preferable. This is because the laser beam can recover the defects of the single-crystal semiconductor layer 102, without heating the supporting substrate 101 excessively. For the laser beam, a gas laser typified by an excimer laser or a solid-state laser typified by a YAG laser can be used as a light source. A wavelength of the laser beam is preferably in a range of from ultraviolet light to a visible light region, and a wavelength of 190 nm to 700 nm is applied. The laser beam emitted from the light source is preferably condensed into a rectangular or linear shape by an optical system, and the single-crystal semiconductor layer 102 may be scanned with such a laser beam. Besides, flash lamp annealing which is performed using a halogen lamp, a xenon lamp, or the like as an energy beam may be applied for a similar object.

In FIG. 5A, the single-crystal semiconductor layer 102 is dehydrogenated in this step; therefore, crystal defects can be repaired without causing a void in the single-crystal semiconductor layer 102. In addition, in FIG. 5B, when treatment of irradiating the single-crystal semiconductor layer 102 with an energy beam is performed in a nitrogen atmosphere, the surface of the single-crystal semiconductor layer 102 can be planarized.

Figure 6A:
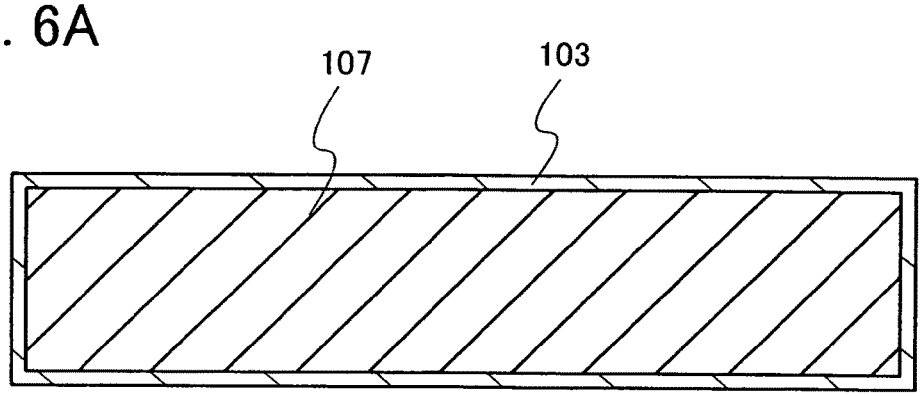
FIGS. 6A and 6B are cross-sectional views of a manufacturing method of a semiconductor substrate according to the present invention.
Figure 6B:
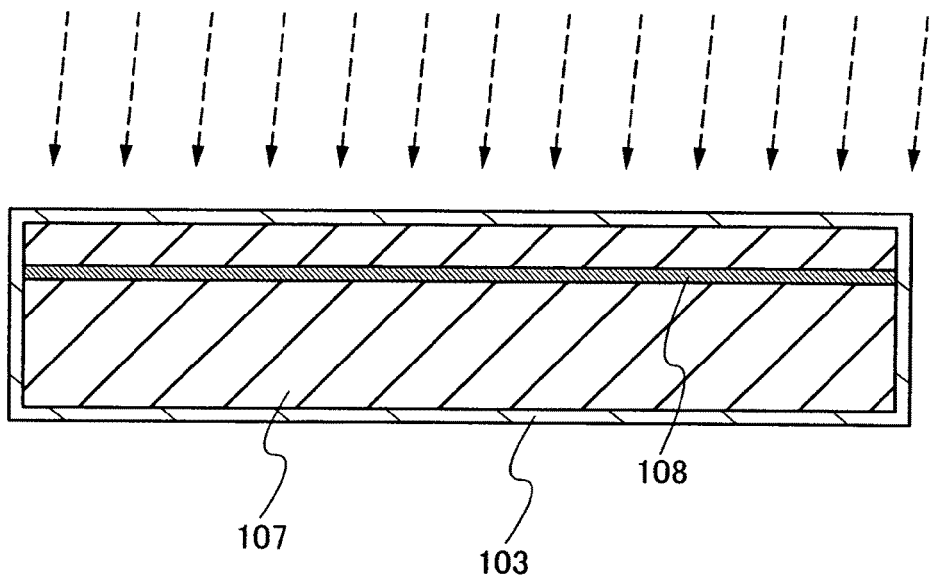

Next, another manufacturing method of the single-crystal semiconductor substrate will be described with reference to FIGS. 6A to 8B. In FIG. 6A, the insulating layer 103 including a halogen is formed on the single-crystal semiconductor substrate 107. The insulating layer 103 including a halogen is preferably formed by thermal oxidation at a temperature of 700° C. or higher, preferably from 950° C. to 1150° C. in an atmosphere containing HCl at 0.5 to 10 volume % (preferably 3 volume %) with respect to oxygen. Then, the separation layer 108 is formed as shown in FIG. 6B.

Figure 7A:
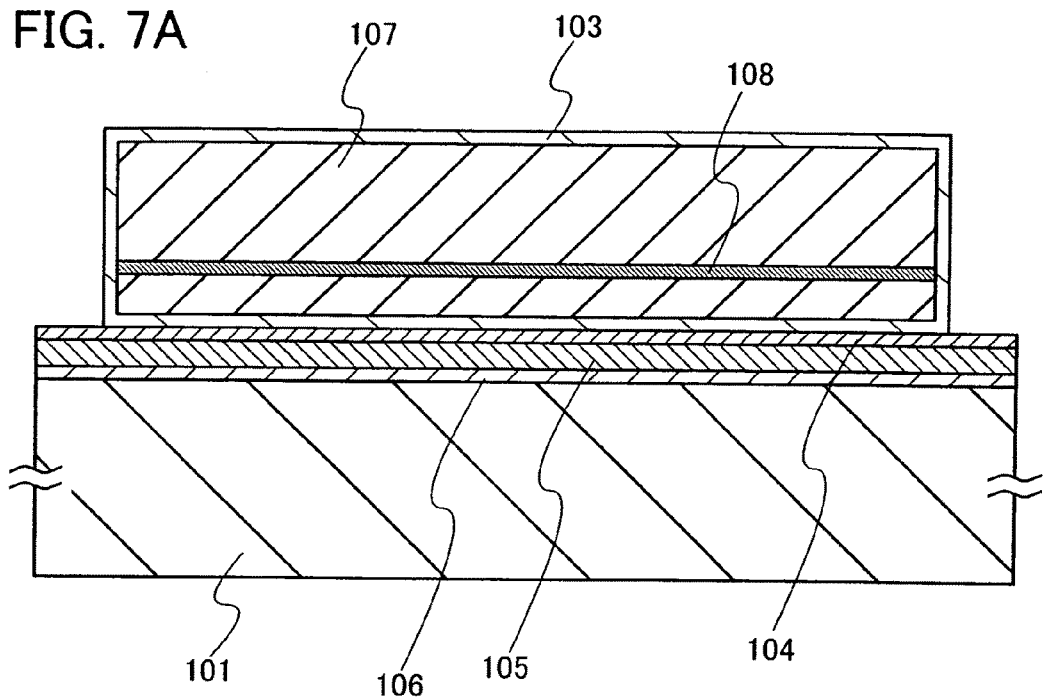
FIGS. 7A and 7B are cross-sectional views of a manufacturing method of a semiconductor substrate according to the present invention.

In FIG. 7A, the barrier layer 106, the relief layer 105, and the bonding layer 104 are provided over the supporting substrate 101. As the barrier layer 106, a silicon nitride layer or a silicon nitride oxide layer is formed with a thickness of from 50 nm to 200 nm by a vapor deposition method. For example, the silicon nitride film is formed by a plasma CVD method using $SiH_4$ and $NH_3$ as source gases. The silicon nitride oxide layer is formed by a plasma CVD method using $SiH_4$, $N_2O$, and $NH_3$. The barrier layer 106 has an effect of preventing impurity diffusion. As the relief layer 105, a silicon oxide film or a silicon oxynitride film is preferably formed by a plasma CVD method, and the thickness of the relief layer 105 is 10 nm to 5000 nm, and preferably 30 nm to 1000 nm. In the case of forming the silicon oxynitride film, $SiH_4$ and $N_2O$ may be used as source gases, and the silicon oxynitride film is preferably deposited at a temperature of 500° C. or lower so as to include nitrogen at a concentration of less than 20 at. % (preferably, 0.01 to 10 at. %) and hydrogen (and/or an OH group) at a concentration of 1 to 20 at. %.

The bonding layer 104 is a layer having a smooth and hydrophilic surface. An insulating layer which is formed by chemical reaction is preferable as a layer having such a surface. The bonding layer 104 which has a smooth and hydrophilic surface is provided with a thickness of from 0.2 nm to 500 nm. With such a thickness, it is possible to smooth surface roughness of a film on which a bonding layer is to be formed and also to secure smoothness of a surface of the bonding layer itself. As the bonding layer 104, a silicon oxide film is preferably formed. The thickness of the silicon oxide film is 10 nm to 200 nm, preferably 10 nm to 100 nm, and more preferably 20 nm to 50 nm. The silicon oxide film is preferably formed by a chemical vapor deposition method with the use of an organic silane gas.

The supporting substrate 101, over which the barrier layer 106, the relief layer 105, and the bonding layer 104 are formed, and the single-crystal semiconductor substrate 107 on which the insulating layer 103 including a halogen is formed, are made in close contact and bonded to each other. In this case, the insulating layer 103 including a halogen and the bonding layer 104 are bonded to each other. By pressing the supporting substrate 101 and the single-crystal semiconductor substrate 107, strong bonding can be formed by hydrogen bonding.

Figure 7B:
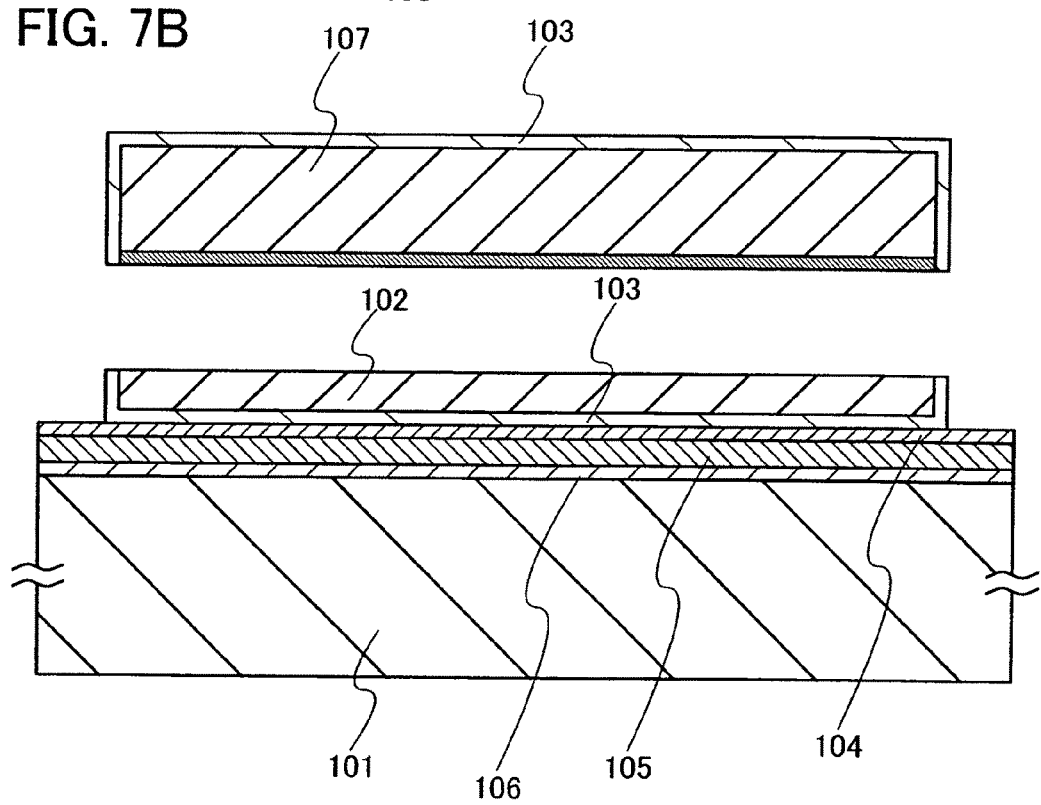

FIG. 7B shows a stage in which the single-crystal semiconductor layer 102 is separated from the single-crystal semiconductor substrate 107. Heat treatment is conducted with the single-crystal semiconductor substrate 107 and the supporting substrate 101 superposed on each other. By the heat treatment, the single-crystal semiconductor substrate 107 is separated with the single-crystal semiconductor layer 102 left over the supporting substrate 101. The heat treatment is preferably conducted at a temperature higher than or equal to the formation temperature of the bonding layer 104, that is, higher than or equal to 400° C. and lower than 600° C. By conducting the heat treatment at a temperature within such a range, the volume of minute voids formed in the separation layer 108 is changed, so that separation can be conducted along the separation layer 108. Since the bonding layer 104 is bonded to the supporting substrate 101, the single-crystal semiconductor layer 102 having the same crystallinity as the single-crystal semiconductor substrate 107 is bonded to the supporting substrate 101.

Figure 8A:
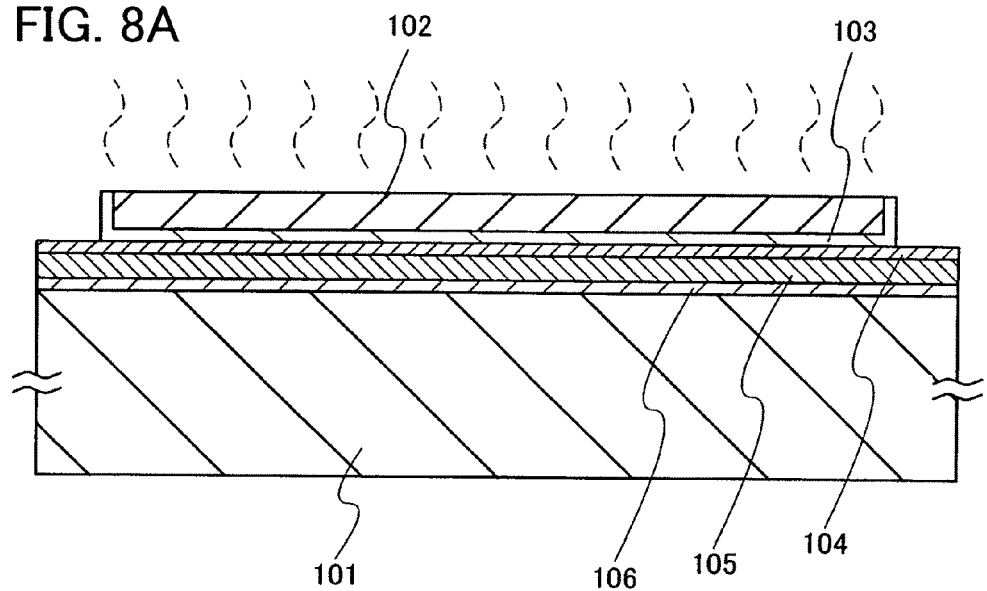
FIGS. 8A and 8B are cross-sectional views of a manufacturing method of a semiconductor substrate according to the present invention.
Figure 8B:
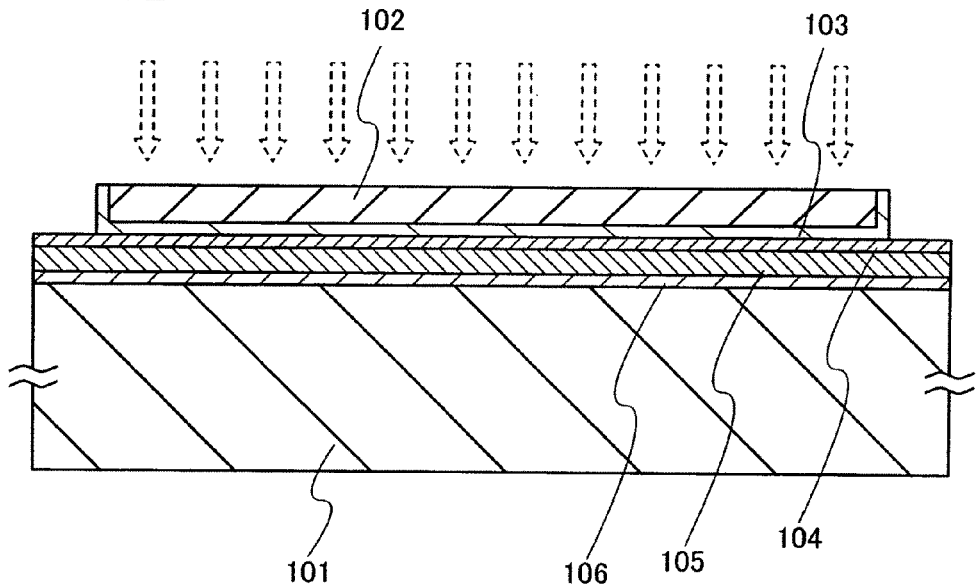

FIG. 8A shows a stage in which heat treatment is conducted with the single-crystal semiconductor layer 102 bonded to the supporting substrate 101, and this stage is similar to that of FIG. 5A. By such heat treatment, hydrogen bonding between the supporting substrate 101 and the single-crystal semiconductor layer 102 can be changed into covalent bonding that is stronger than the hydrogen bonding. In addition, FIG. 8B shows a stage in which the single-crystal semiconductor layer 102 is irradiated with an energy beam to recover crystal defects, and this stage is similar to that of FIG. 5B.

According to this embodiment mode, even when a substrate having heat resistant temperature of 700° C. or lower, such as a glass substrate is used as the supporting substrate 101, the single-crystal semiconductor layer 102 can be strongly bonded to the supporting substrate 101. As the supporting substrate 101, various types of glass substrates used in the electronics industry, which are called "non-alkali glass substrates," such as aluminosilicate glass substrates, aluminoborosilicate glass substrates, and barium borosilicate glass substrates can be applied. In other words, a single-crystal semiconductor layer can be formed on a substrate that is longer than one meter on one side. With the use of such a large-area substrate, a semiconductor device, which is not only a display device such as a liquid crystal display but also a semiconductor integrated circuit, can be manufactured. In addition, as to the single-crystal semiconductor substrate, thermal oxidation is performed in an atmosphere containing a halogen in an initial stage of the process, so that a gettering effect can be obtained, which is effective in reutilizing the single-crystal semiconductor substrate.

Figure 12A:
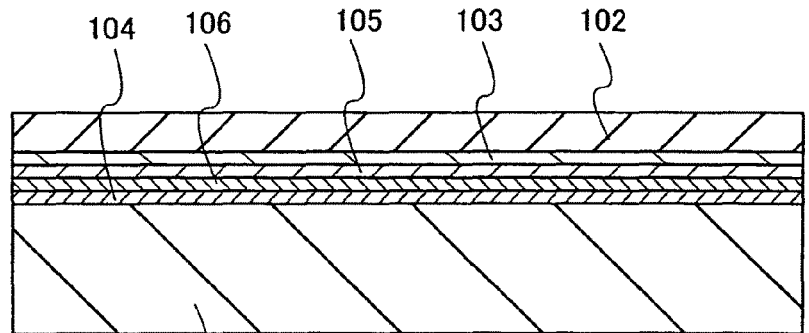
FIGS. 12A to 12D are cross-sectional views of a manufacturing method of a semiconductor substrate according to the present invention.

Next, a semiconductor device of this embodiment mode will be described with reference to FIGS. 12A to 14. In FIG. 12A, the single-crystal semiconductor layer 102 is provided over the supporting substrate 101. The insulating layer 103 including a halogen, the relief layer 105, the barrier layer 106, and the bonding layer 104 are provided between the single-crystal semiconductor layer 102 and the supporting substrate 101. In other words, the bonding layer 104, the barrier layer 106, the relief layer 105, the insulating layer 103 including a halogen, and the single-crystal semiconductor layer 102 are provided in this order from the supporting substrate 101 side. This stacked structure is the same as that of FIG. 1A. A case which uses this stacked structure will be described below; however, other structures shown in FIGS. 1A to 2B can also be employed.

The thickness of the single-crystal semiconductor layer 102 is set to be 5 nm to 500 nm, preferably 10 nm to 200 nm, and more preferably 10 nm to 60 nm. The thickness of the single-crystal semiconductor layer 102 can be set by controlling the depth of the separation layer 108 as shown in FIG. 3B. To the single-crystal semiconductor layer 102, a p-type impurity element such as boron, aluminum, or gallium or an n-type impurity element such as phosphorus or arsenic is preferably added in accordance with a formation region of an n-channel field-effect transistor or a p-channel field-effect transistor. In other words, an n-type impurity element is added to a formation region of an n-channel field-effect transistor or a p-type impurity element is added to a formation region of a p-channel field-effect transistor, whereby so-called well regions are formed. The dose of ions of an impurity element may be approximately $1 \times 10^{12}$ ions/cm$^2$ to $1 \times 10^{14}$ ions/cm$^2$. Furthermore, in the case of controlling the threshold voltage of the field-effect transistors, a p-type or n-type impurity element may be added to the well region.

Figure 12B:
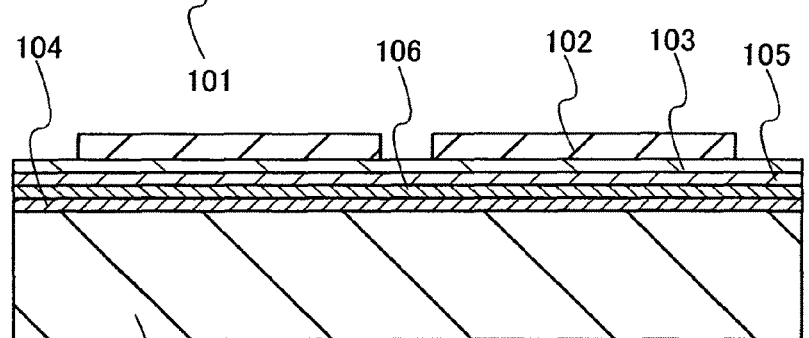
Figure 12C:
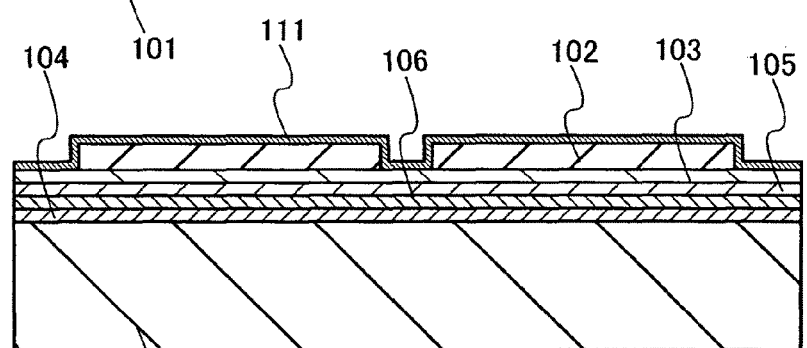

In FIG. 12B, the single-crystal semiconductor layer 102 is etched to be separated into island shapes in accordance with arrangement of semiconductor elements. As shown in FIG. 12C, a gate insulating layer 111 is formed. The gate insulating layer 111 is formed with a thickness of from 5 nm to 50 nm. The gate insulating layer 111 is preferably formed of a silicon oxide film or a silicon oxynitride film by a vapor deposition method. In the case of forming the gate insulating layer 111 with high quality at a temperature of 450° C. or lower, a plasma CVD method is preferably used. In particular, a microwave plasma CVD method where the electron density is greater than or equal to $1 \times 10^{11}$ cm$^{-3}$ and less than or equal to $1 \times 10^{13}$ cm$^{-3}$ and the electron temperature is greater than or equal to 0.2 eV and less than or equal to 2.0 eV (more preferably, greater than or equal to 0.5 eV and less than or equal to 1.5 eV) is preferably used. When plasma with high electron density, a low electron temperature, and low kinetic energy of active species is used, the gate insulating layer 111 which has little plasma damage and few defects can be formed. In this case, a silicon oxynitride film formed using a nitrogen oxide gas, and a silicon hydride gas or a silicon fluoride gas (typically, N$_2$O and SiH$_4$) is preferably formed by a microwave plasma CVD method. An example of an apparatus suitable for formation of the gate insulating layer 111 will be described below.

Figure 9:
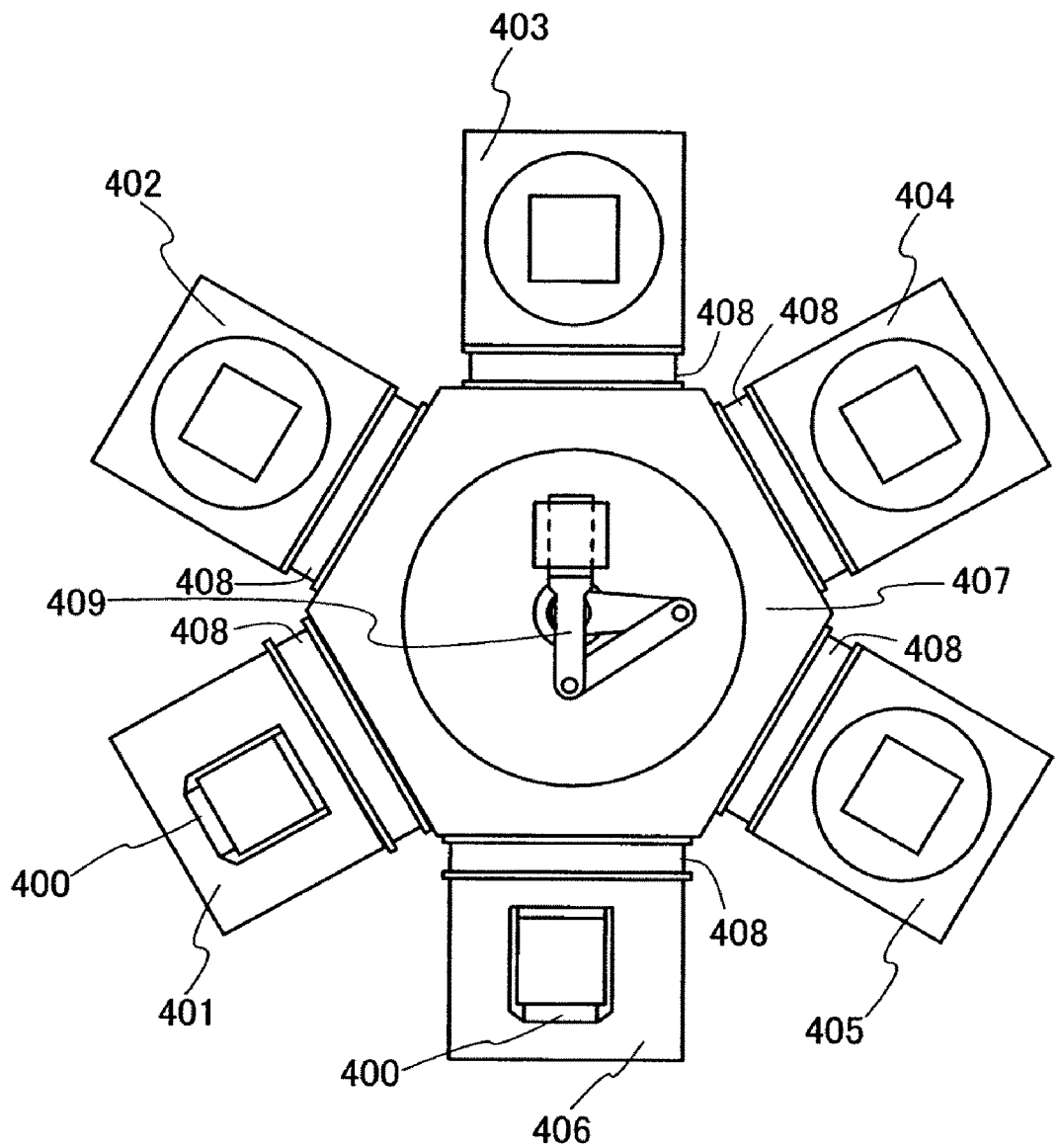
FIG. 9 is a plane view showing an example of a multi-chamber microwave plasma CVD apparatus including a plurality of reaction chambers.

FIG. 9 shows an example of a multi-chamber microwave plasma CVD apparatus including a plurality of reaction chambers. This apparatus has a structure including a load chamber 401, an unload chamber 406, reaction chambers 402 to 404, a spare chamber 405 around a common chamber 407. A gate valve 408 is provided between the common chamber 407 and each of the rest of the chambers so that processing carried out in different chambers may not interferer with each other. A substrate is set in a cassette 400 in each of the load chamber 401 and the unload chamber 406 and carried to the reaction chambers 402 to 404 with a transfer unit 409 in the common chamber 407. In this apparatus, a reaction chamber can be provided for each film, and plural different kinds of films can be consecutively formed without being exposed to the air.

Figure 10:
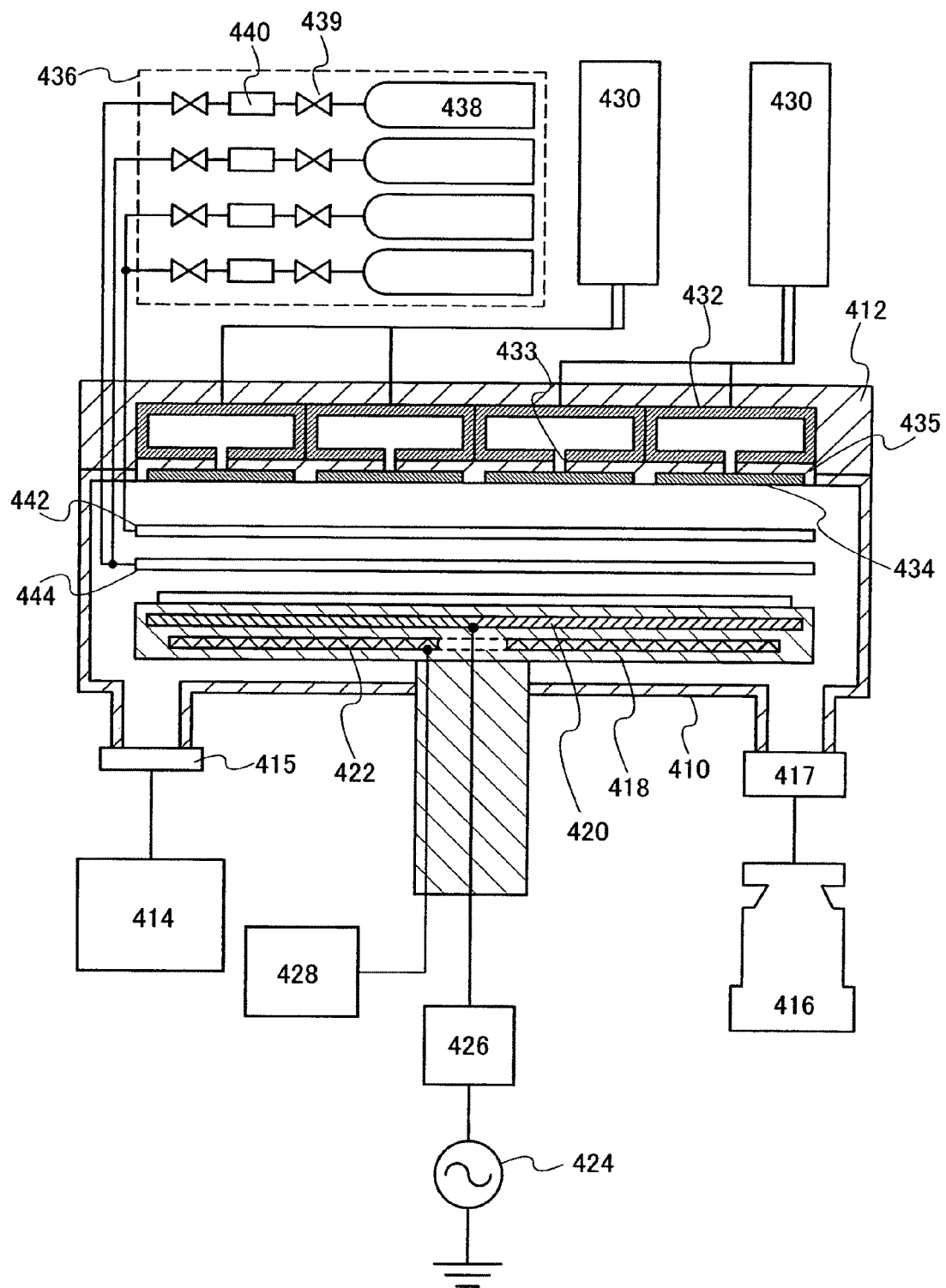
FIG. 10 is a cross-sectional view of a structure of a reaction chamber in a multi-chamber microwave plasma CVD apparatus including a plurality of reaction chambers.

FIG. 10 shows an example of a reaction chamber in detail. FIG. 10 shows a cross-sectional structure of a reaction chamber. The reaction chamber includes a processing container 410 and a cover 412, and the inside of the chamber can be held at a reduced pressure by a sealed structure. The processing container 410 is, for example, formed of metal such as stainless steel or aluminum.

In order to reduce the pressure inside the chamber, a low-vacuum evacuation unit 414 and a high-vacuum evacuation unit 416 are connected to the processing container 410. The low-vacuum evacuation unit 414 operates a switching valve 415 and evacuates the chamber from the atmospheric pressure to about 0.1 Pa, and for example, the low-vacuum evacuation unit 414 is formed using a dry pump. The high-vacuum evacuation unit 416 evacuates the chamber to a pressure as high as 0.1 Pa or lower, and is formed using a turbo-molecular pump. A pressure control valve 417 connected to the high-vacuum evacuation unit 416 in series controls gas flow conductance, can control evacuation speed of a reaction gas which is supplied from a gas supply unit 436 so that pressure inside the chamber can be kept in a predetermined range.

A susceptor 418 over which a process object such as a substrate is placed is provided inside the processing container 410. The susceptor 418 is formed of a ceramic material such as aluminum nitride, silicon nitride, or silicon carbide. A power feed section 420 and a heater 422 are provided inside the susceptor 418. A high-frequency power source 424 is connected to the power feed section 420 via a matching box 426. A high-frequency power output from the high-frequency power source 424 is applied to the power feed section 420, so that a bias voltage is applied to a substrate placed on the susceptor 418.

The heater 422 is connected to a heater power supply 428. The heater 422 is embedded in the susceptor 418 and is heated by supply of power from the heater power supply 428. Such heater 422 keeps the substrate that is placed on the susceptor 418 at a predetermined temperature.

The gas supply unit 436 includes a cylinder 438 filled with a source gas, a valve 439, a mass flow controller 440, and the like. A treatment gas whose flow rate is adjusted by the mass flow controller 440 is introduced into the processing container 410. In the processing container 410, a gas supply nozzle (upper side) 442 and a gas supply nozzle (lower side) 444 are provided, and the source gas flows out into the processing container 410 from the nozzles. For example, an inert gas or a hydrogen gas, which stabilizes plasma, can be supplied in the gas supply nozzle (upper side) 442, and a source gas for film deposition can be supplied in the gas supply nozzle (lower side) 444. In such a manner, different gas supply nozzles can be used for different purposes.

The cover 412 is provided to seal an upper part of the processing container 410. In the cover 412, a waveguide 432 is arranged so as to be in contact with a top plate 435. The waveguide 432 is connected to a microwave power supply 430. A slit 433 is provided in the waveguide 432 and the top plate 435 so as to leak the microwave. The slit 433 is blocked using a dielectric plate 434, so that airtightness in the processing container 410 is held. The microwave is introduced into the processing container 410 through the dielectric plate 434, so that plasma is generated.

Figure 11:
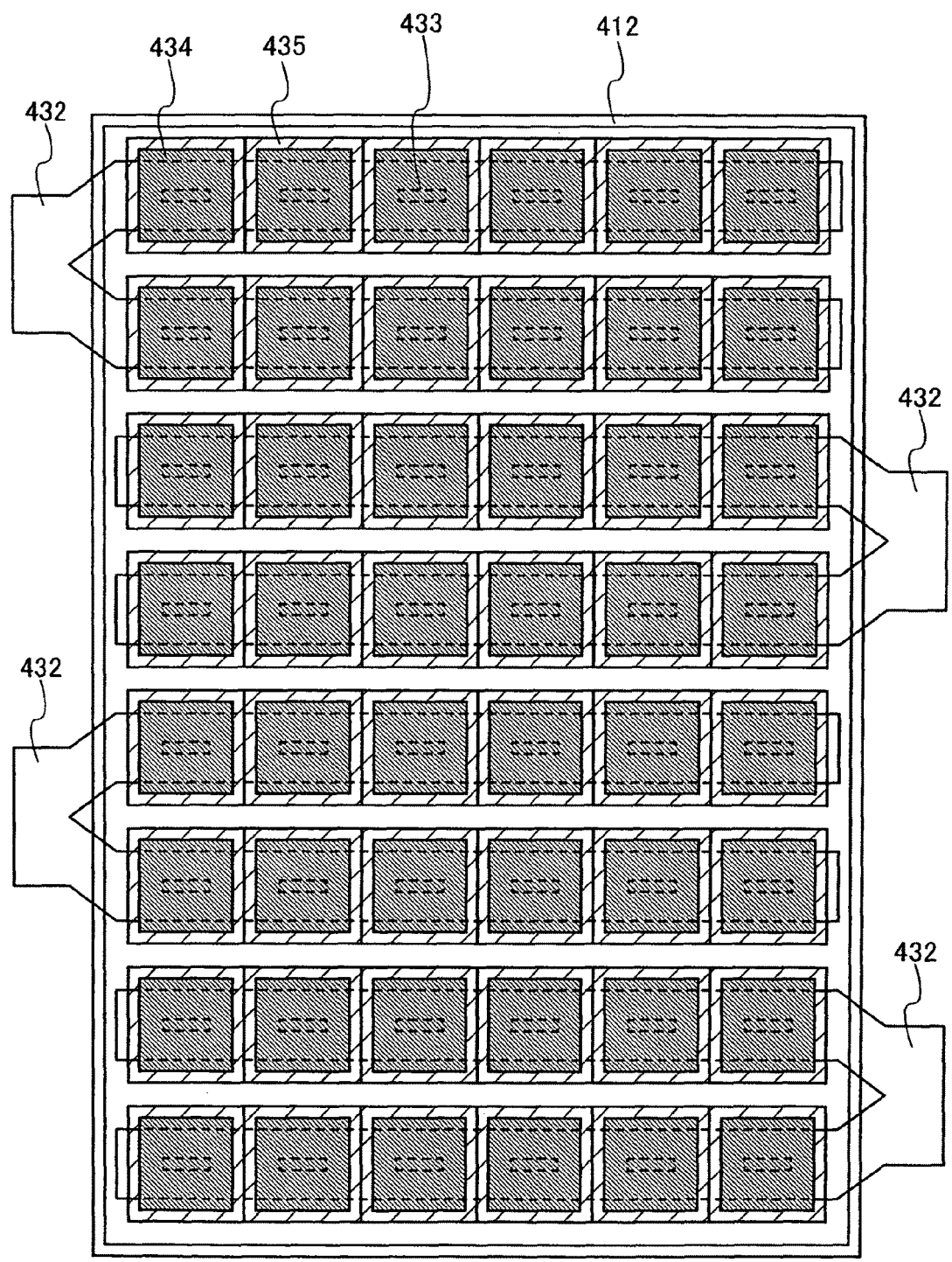
FIG. 11 is a plane view of a structure of a multi-chamber microwave plasma CVD apparatus including a plurality of reaction chambers.

FIG. 11 is a plain view showing a structure of the cover 412. The waveguides 432 are extended in parallel to the top plates 435, and a plurality of waveguides 432 are arranged in parallel to each other. The dielectric plates 434 are arranged in matrix on the top plates 435. The slits 433 provided for the waveguides 432 and the top plates 435 are provided corresponding to positions of each dielectric plate 434. When the substrate to be processed has a large area (e.g., a glass substrate of 730 mm×920 mm or a glass substrate of a size which has one side exceeding 1 m), the waveguide 432 is preferably divided into a plurality and a microwave is supplied. FIG. 11 shows a structure in which branch waveguides are used at an end portion of each waveguide 432. The microwave power supply is connected to the tip of each branch waveguide. Use of a plurality of microwave power supplies makes it possible to keep uniformity of plasma even when the area of the substrate to be processed becomes large.

The gate insulating layer 111 may be formed of silicon oxide or silicon oxynitride; it is preferable that the gate insulating layer 111 be formed of silicon oxynitride containing nitrogen as described above in terms of the withstand voltage. In the case of forming a silicon oxynitride film with the above-described microwave plasma CVD apparatus, a nitrogen oxide gas, and a silicon hydride gas or a silicon fluoride gas (typically, $N_2O$ and $SiH_4$) are used as source gases. In the case of using $SiH_4$, it is preferable that the flow ratio of $N_2O$ to $SiH_4$ be 100:1 to 200:1. Further, in order to stabilize the state of plasma, argon and/or helium is/are preferably supplied as a rare gas at that time. In other words, it is preferable that argon and/or helium be introduced into a reaction chamber, the pressure be set in a predetermined pressure of 20 to 40 Pa, plasma be generated by supplying microwave power, and then source gases of $N_2O$ and $SiH_4$ be supplied in this order. The film deposition temperature is set at from 250° C. to 400° C. (preferably from 300° C. to 350° C., typically 325° C.).

Since microwave plasma has high plasma density, it is desirable to perform treatment, in advance, of coating an inner wall of the reaction chamber with a film having the same quality as a film to be deposited over a process substrate so that impurities may not enter the film to be deposited over the process substrate from the inner wall in film formation.

Figure 21:
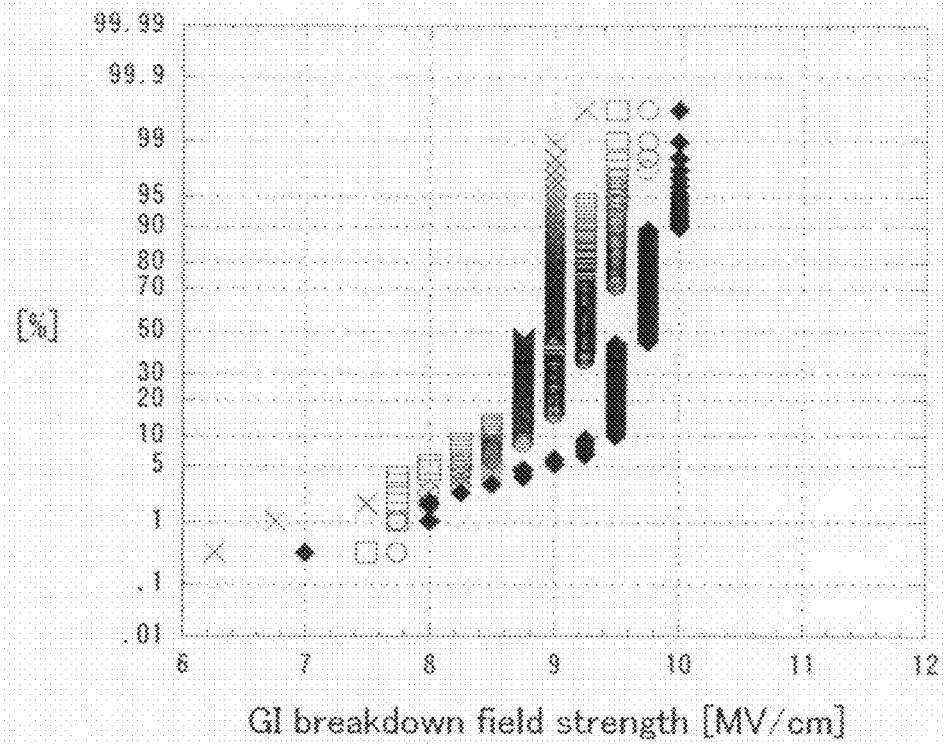
FIG. 21 is a graph showing evaluation results of withstand voltages of silicon oxynitride films which are formed by a microwave plasma CVD method using $SiH_4$ and $N_2O$ as main source gases.
Figure 21:
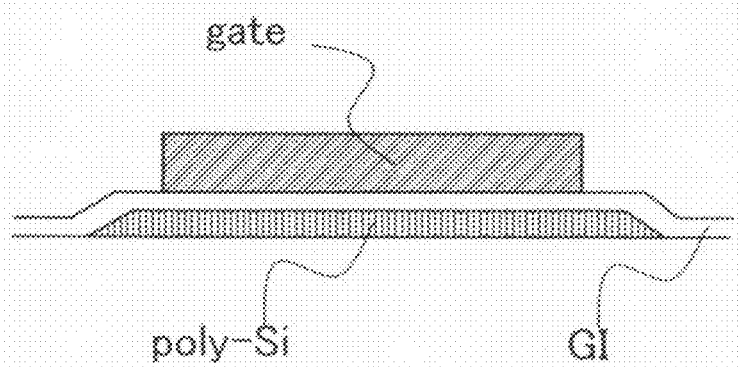
Figure 22:
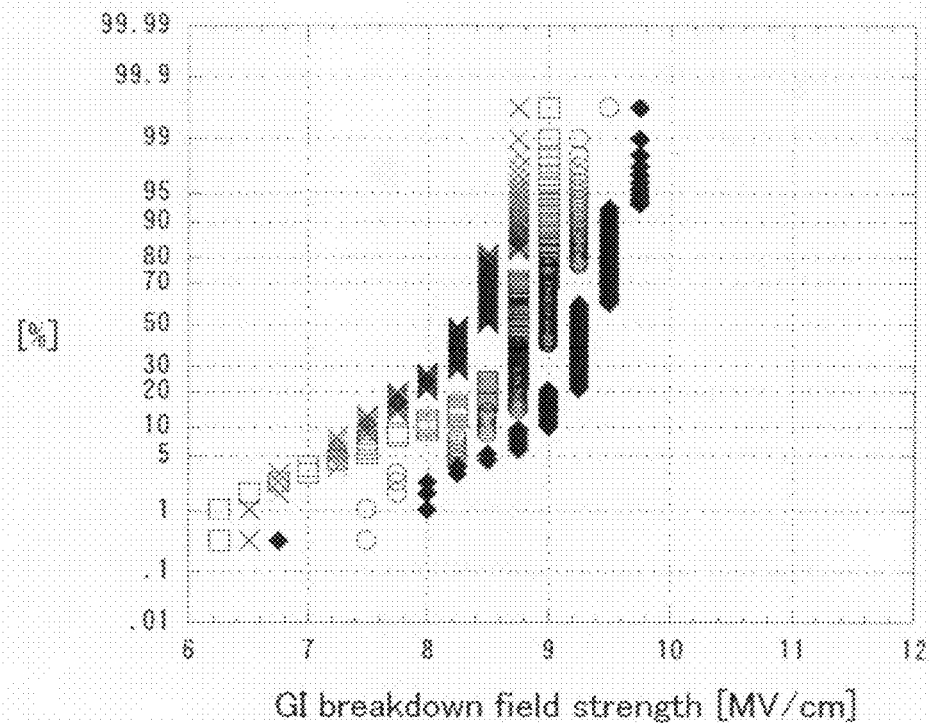
FIG. 22 is a graph showing evaluation results of withstand voltages of silicon oxynitride films which are formed by a microwave plasma CVD method using $SiH_4$ and $N_2O$ as main source gases.
Figure 22:
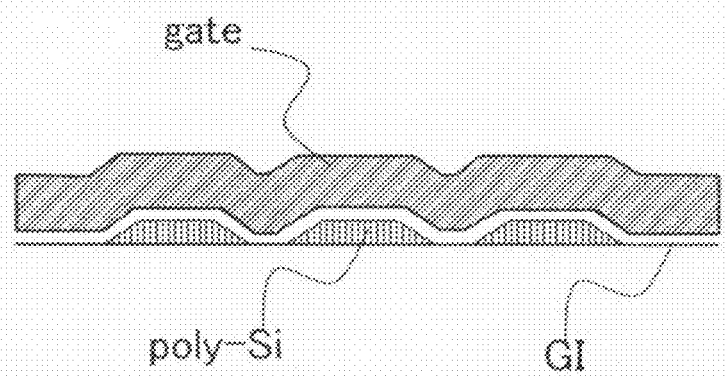

FIG. 21 and FIG. 22 show results of evaluating the GI withstand voltage of silicon oxynitride films formed by a microwave plasma CVD method using $SiH_4$ and $N_2O$ as main source gases. Samples each have a structure in which a silicon oxynitride film with a thickness of 20 nm is stacked as a gate insulating layer over a polysilicon film with a thickness of 66 nm, and a metal electrode is provided thereover as a gate electrode. The voltage at which the current density reaches $1\times10^{-3}$ A/cm$^2$ is defined as a breakdown voltage, from the current-voltage characteristics in the case where bias voltage is applied between the polysilicon and a metal electrode, and FIG. 21 and FIG. 22 show a plot of the percentage of elements whose current density reaches the above-mentioned value, with respect to the applied voltage (in this case, applied field strength). FIG. 21 shows the GI withstand voltage characteristics of a plane surface, where the x-axis indicates the GI breakdown field strength, and FIG. 22 shows the GI withstand voltage characteristics of a silicon oxynitride film which is formed on a polysilicon film having a line and space pattern with a pitch of 2.5 μm in consideration of step coverage of the silicon oxynitride film, where the x-axis indicates the GI breakdown field strength. Table 1 shows values of breakdown field strengths of the samples with various gas flow ratios and film forming pressures, which are obtained by calculation using the breakdown voltage. The breakdown field strengths are all 9 MV/cm or greater, which is favorable. The graph shows that the withstand voltage depends on the film forming pressure and the withstand voltage tends to be higher when the pressure becomes lower.

TABLE 1

| Condition | Breakdown field strength (MV/cm) | |
|---|---|---|
| | plane surface model | line and space model |
| Gas ratio; $N_2O/SiH_4$ = 200, 30 Pa | 10.0 | 9.8 |
| Gas ratio; $N_2O/SiH_4$ = 100, 30 Pa | 9.8 | 9.2 |
| Gas ratio; $N_2O/SiH_4$ = 100, 35 Pa | 9.5 | 9.0 |
| Gas ratio; $N_2O/SiH_4$ = 100, 40 Pa | 9.0 | 8.7 |

Figure 12D:
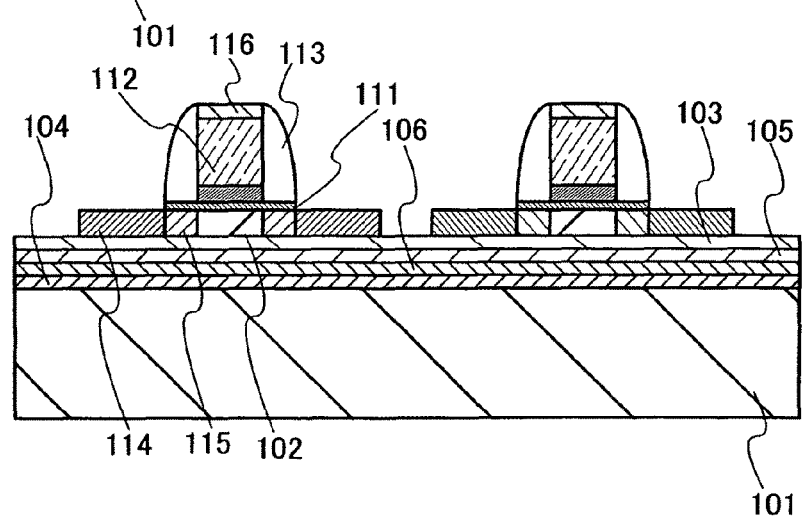

After forming the gate insulating layer 111 by such a microwave plasma CVD apparatus which generates high density plasma, as shown in FIG. 12D, a gate electrode 112 and a sidewall insulating layer 113 are formed and a first impurity region 114 and a second impurity region 115 are formed. An insulating layer 116 is formed of silicon nitride and is used as a hard mask in etching the gate electrode 112.

Figure 13A:
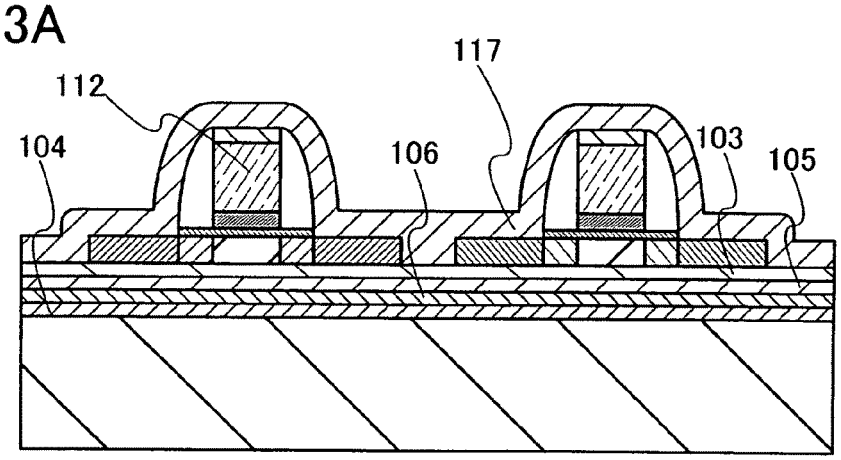
FIGS. 13A to 13C are cross-sectional views of a manufacturing method of a semiconductor substrate according to the present invention.

FIG. 13A shows a stage in which a protective film 117 is formed after formation of the gate electrode 112 and the like. As the protective film 117, a silicon nitride film or a silicon nitride oxide film is preferably formed by a plasma CVD method at a substrate temperature of 350° C. or lower during film formation. In other words, the protective film 117 is made to contain hydrogen. After the protective film 117 is formed, hydrogen contained in the protective film 117 is diffused into the single-crystal semiconductor layer 102 side by heat treatment at 350° C. to 450° C. (preferably, 400° C. to 420° C.). By supply of hydrogen, during an element formation step, to the single-crystal semiconductor layer 102, which has been dehydrogenated in the previous step, defects can be compensated effectively. In addition, the barrier layer 106 prevents impurity diffusion from the supporting substrate 101 side, whereas the protective film 117 is effective in preventing contamination due to impurity from the upper layer side. In this embodiment mode, an upper layer side and a lower layer side of the single-crystal semiconductor layer 102 having excellent crystallinity can be covered with insulating films which are highly effective in preventing highly mobile impurity ions of sodium or the like. Therefore, a great effect in stabilizing the characteristics of a semiconductor element manufactured using the single-crystal semiconductor layer 102 is obtained.

Figure 13B:
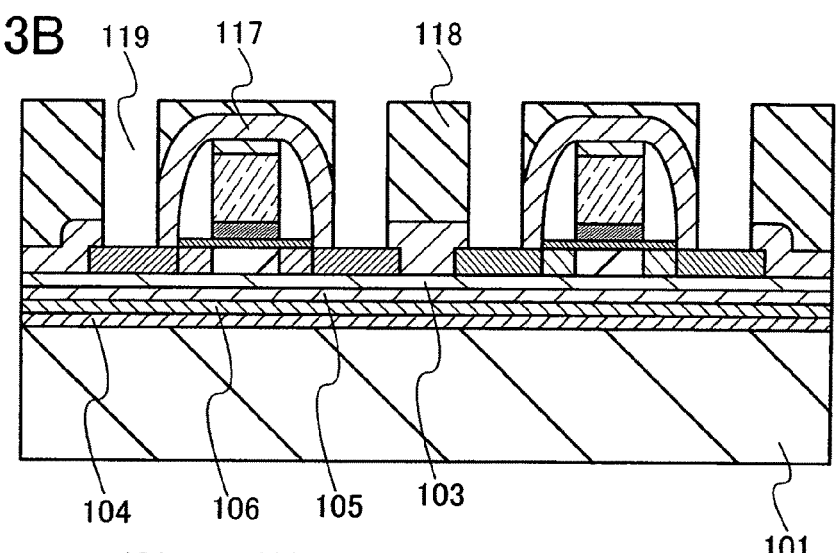

After that, an interlayer insulating layer 118 is formed as shown in FIG. 13B. As the interlayer insulating layer 118, a boron phosphorus silicon glass (BPSG) film is formed or an organic resin typified by polyimide is formed by coating. In the interlayer insulating layer 118, a contact hole 119 is formed.

Figure 13C:
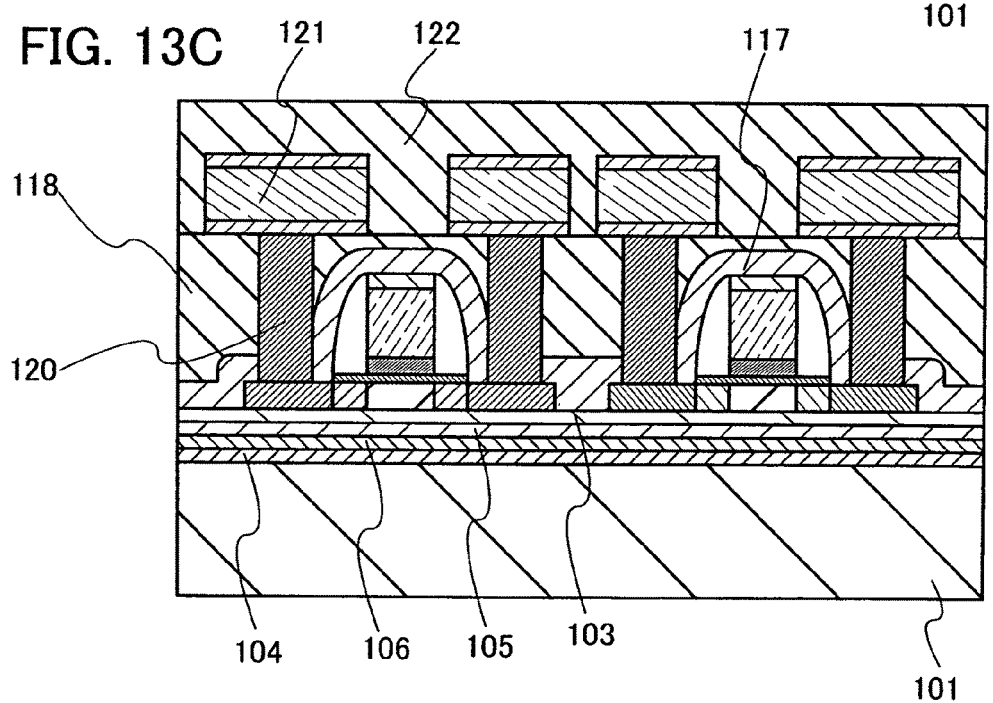

FIG. 13C shows a stage in which a wiring is formed. In the contact hole 119, a contact plug 120 is formed. As the contact plug 120, tungsten silicide is formed by a chemical vapor deposition method using a $WF_6$ gas and a $SiH_4$ gas to fill the contact hole 119. Alternatively, tungsten may be formed by hydrogen reduction of a $WF_6$ gas to fill the contact hole 119. After that, a wiring 121 is formed to correspond to the contact plug 120. The wiring 121 is formed of aluminum or an aluminum alloy, and an upper layer and a lower layer thereof are formed using metal layers of molybdenum, chromium, titanium, or the like as barrier metal. Furthermore, an interlayer insulating layer 122 is formed over the barrier metal. The wiring 121 may be provided as appropriate, and a multilayer wiring may be formed by further forming a wiring layer over the wiring 121. In the case of forming a multilayer wiring, a damascene process may be employed.

Figure 14:
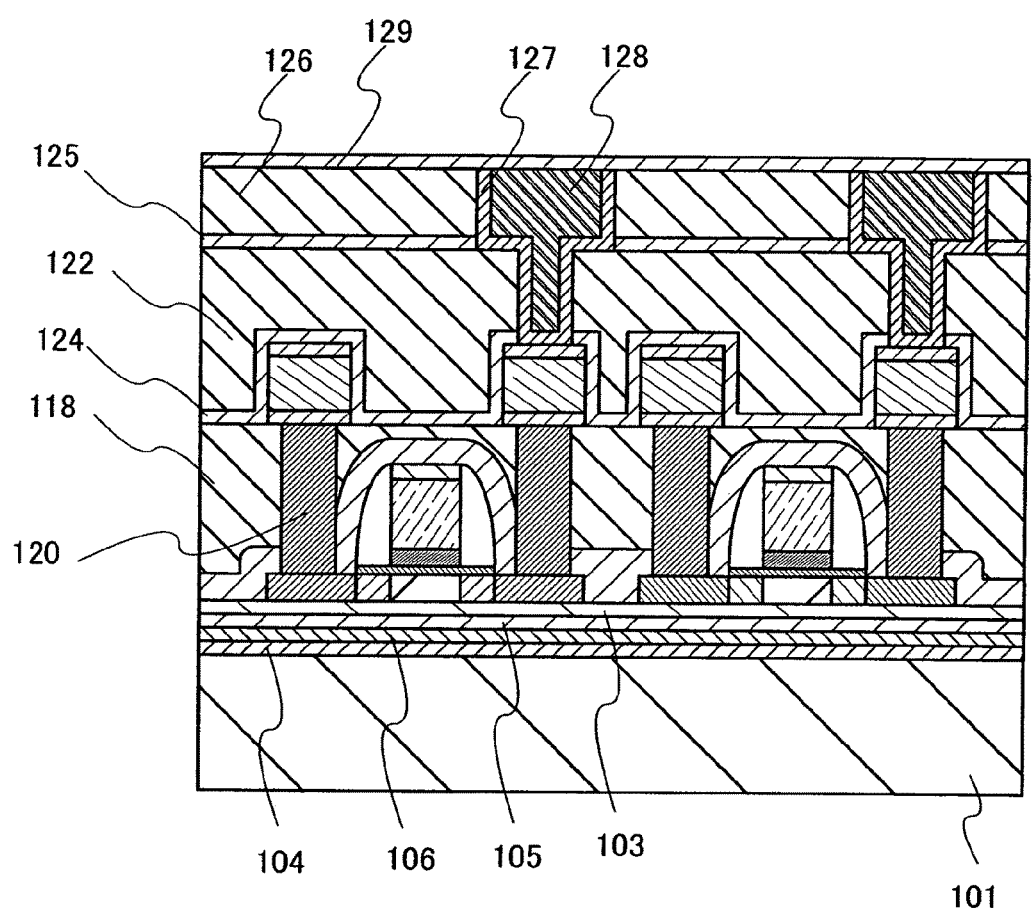
FIG. 14 is a cross-sectional view of a manufacturing method of a semiconductor substrate according to the present invention.

FIG. 14 shows a stage of forming a multilayer wiring by further forming a wiring over the interlayer insulating layer 118. A passivation layer 124 is formed of a silicon nitride film over the wiring 121, and the interlayer insulating layer 122 is provided. Further, a passivation layer 125 and an insulating layer 126 between wirings are formed. A barrier metal 127 is formed of tantalum or tantalum nitride. A copper wiring 128 is formed by a plating method and embedded in the insulating layer 126 between wirings by a chemical mechanical polishing (CMP) method. A passivation layer 129 is formed of silicon nitride thereover. The wiring thus formed as an upper layer can be formed by, for example, a damascene method or a dual-damascene method. The number of layers stacked as wirings is optional and may be selected as appropriate.

In this manner, field-effect transistors can be manufactured using the single-crystal semiconductor layer 102 that is bonded to the supporting substrate 101. The single-crystal semiconductor layer 102 according to this embodiment mode is formed of a single-crystal semiconductor that has uniform crystal orientation; therefore, field-effect transistors with uniformity in electric characteristics and high performance can be obtained. In other words, it is possible to suppress inhomogeneity of electric characteristics which are important transistor characteristics, such as threshold voltage and mobility, and to achieve higher performance such as higher mobility.

The insulating layer 103 including a halogen is provided on the back channel side (the side opposite to the gate electrode 112) of the single-crystal semiconductor layer 102, and local level density is decreased; therefore, variation of threshold voltage can be suppressed. Furthermore, the barrier layer 106 as well as the insulating layer 103 including a halogen is provided between the supporting substrate 101 and the single-crystal semiconductor layer 102; therefore, the single-crystal semiconductor layer 102 can be prevented from being contaminated by diffusion of a metal impurity such as sodium from the supporting substrate 101 side. The relief layer 105 can relieve stress warping of the single-crystal semiconductor layer 102, so that generation of defects generated in stacking can be suppressed.

Figure 15:
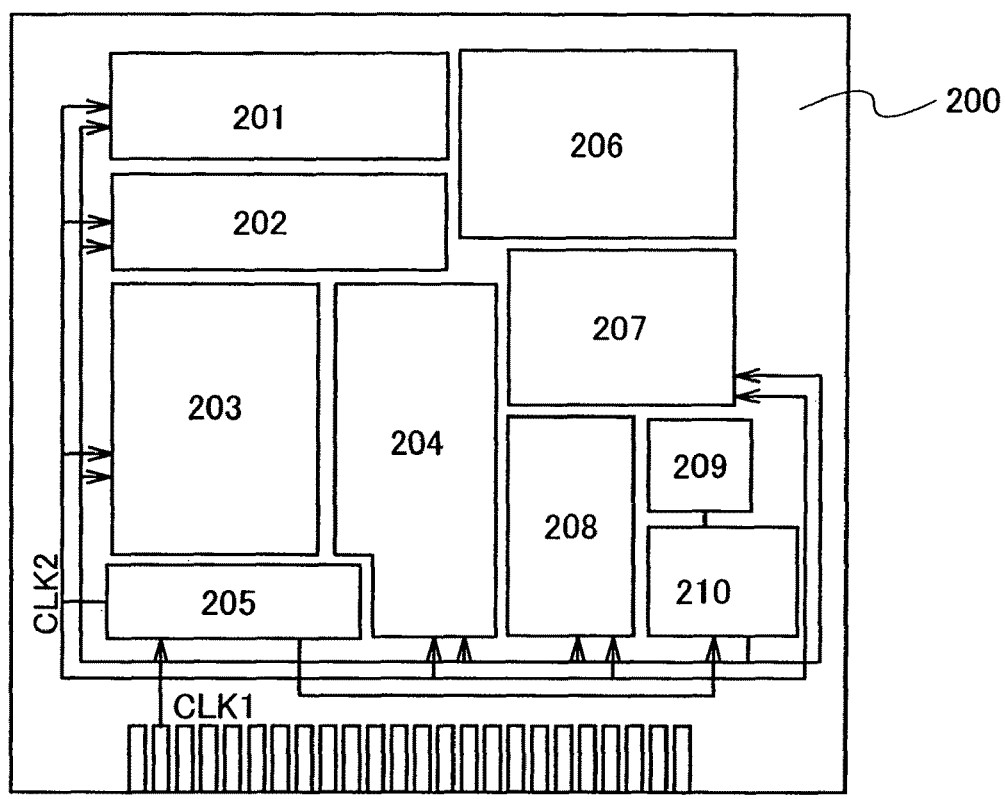
FIG. 15 is a block diagram of a structure of a microprocessor which is obtained using a semiconductor substrate according to the present invention.

FIG. 15 shows an example of a microprocessor 200 as an example of a semiconductor device. The microprocessor 200 is manufactured using the semiconductor substrate of this embodiment mode as described above. The microprocessor 200 includes an arithmetic logic unit (ALU) 201, an ALU controller 202, an instruction decoder 203, an interrupt controller 204, a timing controller 205, a register 206, a register controller 207, a bus interface (Bus I/F) 208, a read-only memory 209, and a ROM interface (ROM I/F) 210.

An instruction input to the microprocessor 200 through the bus interface 208 is input to the instruction decoder 203, decoded therein, and then input to the ALU controller 202, the interrupt controller 204, the register controller 207, and the timing controller 205. The ALU controller 202, the interrupt controller 204, the register controller 207, and the timing controller 205 conduct various controls based on the decoded instruction. Specifically, the ALU controller 202 generates signals for controlling the operation of the ALU 201. While the microprocessor 200 is executing a program, the interrupt controller 204 processes an interrupt request from an external input/output device or a peripheral circuit based on its priority or a mask state. The register controller 207 generates an address of the register 206, and reads and writes data from and to the register 206 in accordance with the state of the microprocessor 200. The timing controller 205 generates signals for controlling timing of operation of the ALU 201, the ALU controller 202, the instruction decoder 203, the interrupt controller 204, and the register controller 207. For example, the timing controller 205 is provided with an internal clock generator for generating an internal clock signal CLK2 based on a reference clock signal CLK1, and supplies the clock signal CLK2 to the various above-mentioned circuits. Note that the microprocessor 200 shown in FIG. 15 is only an example in which the configuration is simplified, and an actual microprocessor may have various configurations depending on the uses.

The microprocessor 200 can achieve not only increase in processing speed but also reduction in power consumption because an integrated circuit is formed using a single-crystal semiconductor layer with uniform crystal orientation which is bonded over a supporting substrate having an insulating surface. An oxide film that contains a halogen is provided on the back channel side (the side opposite to the gate electrode) of the single-crystal semiconductor layer with which the transistor is formed, and local level density is decreased; therefore, variation of threshold voltage can be suppressed. Furthermore, the barrier layer as well as the oxide film including a halogen is provided between the supporting substrate and the single-crystal semiconductor layer; therefore, the single-crystal semiconductor layer can be prevented from being contaminated by diffusion of a metal impurity such as sodium from the supporting substrate side. The relief layer can relieve stress warping of the single-crystal semiconductor layer, so that generation of defects generated in stacking can be suppressed.

Figure 16:
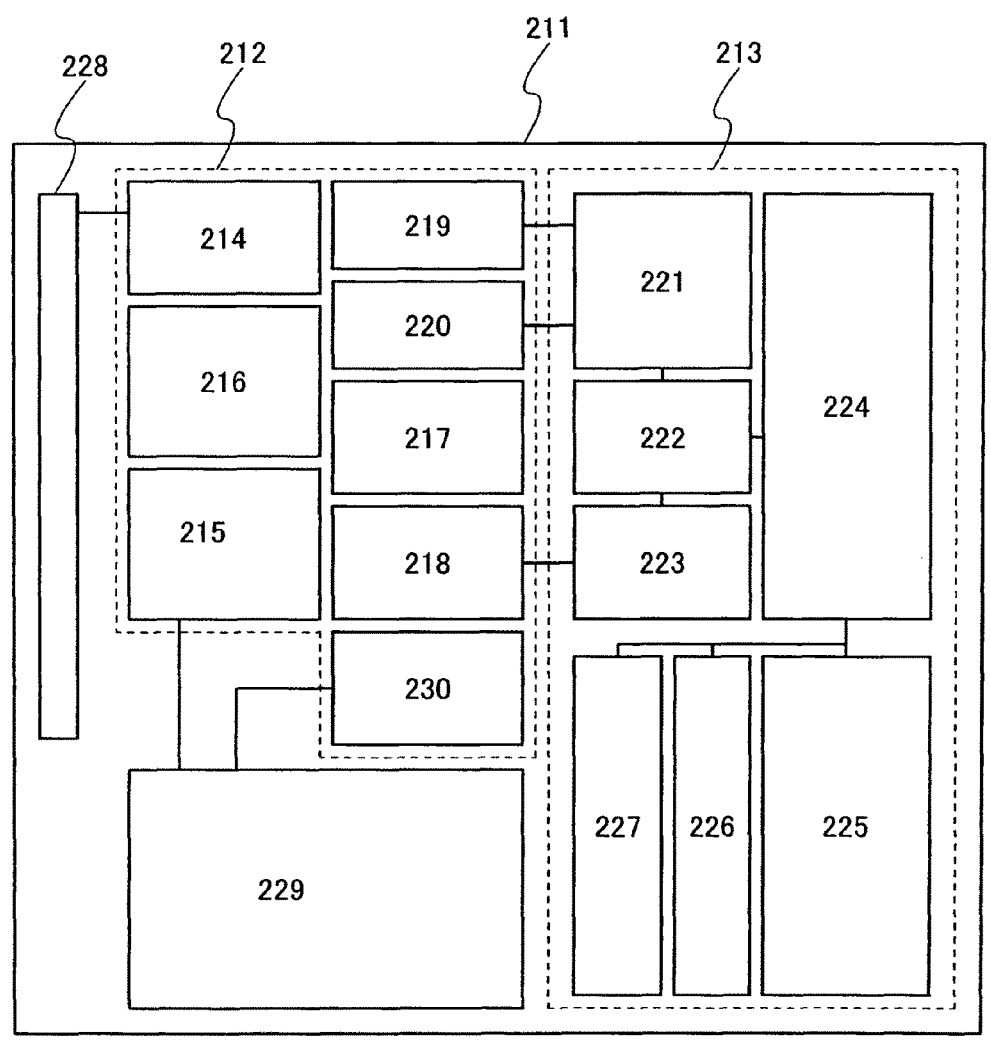
FIG. 16 is a block diagram of a structure of an RFCPU which is obtained using a semiconductor substrate according to the present invention.

Next, an example of a semiconductor device having an arithmetic function that can transmit and receive data without contact is described with reference to FIG. 16. FIG. 16 shows an example of a computer that operates to transmit and receive signals to and from an external device by wireless communication (such a computer is hereinafter referred to as an "RFCPU"). An RFCPU 211 includes an analog circuit portion 212 and a digital circuit portion 213. The analog circuit portion 212 includes a resonance circuit 214 with a resonance capacitor, a rectifier circuit 215, a constant voltage circuit 216, a reset circuit 217, an oscillation circuit 218, a demodulation circuit 219, and a modulation circuit 220. The digital circuit portion 213 includes an RF interface 221, a control register 222, a clock controller 223, a CPU interface 224, a central processing unit (CPU) 225, a random-access memory (RAM) 226, and a read-only memory (ROM) 227.

The operation of the RFCPU 211 having such a configuration is as follows. The resonance circuit 214 generates an induced electromotive force based on a signal received by an antenna 228. The induced electromotive force is stored in a capacitor portion 229 through the rectifier circuit 215. This capacitor portion 229 is preferably formed using a capacitor such as a ceramic capacitor or an electric double layer capacitor. The capacitor portion 229 does not need to be integrated with the RFCPU 211 and it is acceptable as long as the capacitor portion 229 is mounted as a different component on a substrate having an insulating surface which is included in the RFCPU 211.

The reset circuit 217 generates a signal that resets the digital circuit portion 213 to be initialized. For example, the reset circuit 217 generates, as a reset signal, a signal that rises with delay after increase in the power supply voltage. The oscillation circuit 218 changes the frequency and the duty ratio of a clock signal in accordance with a control signal generated by the constant voltage circuit 216. The demodulation circuit 219 having a low pass filter, for example, binarizes amplitude fluctuation of reception signals of an amplitude shift keying (ASK) system. The modulation circuit 220 transmits transmission data by changing the amplitude of transmission signals of an amplitude shift keying (ASK) system. The modulation circuit 220 changes the resonance point of the resonance circuit 214, thereby changing the amplitude of communication signals. The clock controller 223 generates a control signal for changing the frequency and the duty ratio of the clock signal in accordance with the power supply voltage or current consumption in the central processing unit (CPU) 225. The power supply voltage is monitored by a power supply control circuit 230.

A signal input from the antenna 228 to the RFCPU 211 is demodulated by the demodulation circuit 219 and then decomposed into a control command, data, and the like by the RF interface 221. The control command is stored in the control register 222. The control command includes reading of data stored in the read-only memory (ROM) 227, writing of data to the random-access memory (RAM) 226, an arithmetic instruction to the central processing unit (CPU) 225, and the like. The central processing unit (CPU) 225 accesses the read-only memory (ROM) 227, the random-access memory (RAM) 226, and the control register 222 via the CPU interface 224. The CPU interface 224 has a function of generating an access signal for any of the read-only memory (ROM) 227, the random-access memory (RAM) 226, and the control register 222 based on an address the central processing unit (CPU) 225 requests.

As an arithmetic method of the central processing unit (CPU) 225, a method may be employed in which the read-only memory (ROM) 227 stores an operating system (OS) and a program is read and executed at the time of starting operation. Alternatively, a method may be employed in which a circuit dedicated to arithmetic is formed as an arithmetic circuit and arithmetic processing is conducted using hardware. In a method in which both hardware and software are used, part of processing can be conducted by a circuit dedicated to arithmetic and the other part of the arithmetic processing can be conducted by the central processing unit (CPU) 225 using a program.

The RFCPU 211 can achieve not only increase in processing speed but also reduction in power consumption because an integrated circuit is formed using a single-crystalline semiconductor layer with uniform crystal orientation which is bonded over a substrate having an insulating surface or an insulating substrate. This makes it possible to ensure the operation for a long period even when the capacitor portion 229 which supplies power is downsized. Although FIG. 16 shows a mode of the RFCPU, the semiconductor device may be an IC tag or the like as long as it has a communication function, an arithmetic processing function, and a memory function.

Figure 17A:
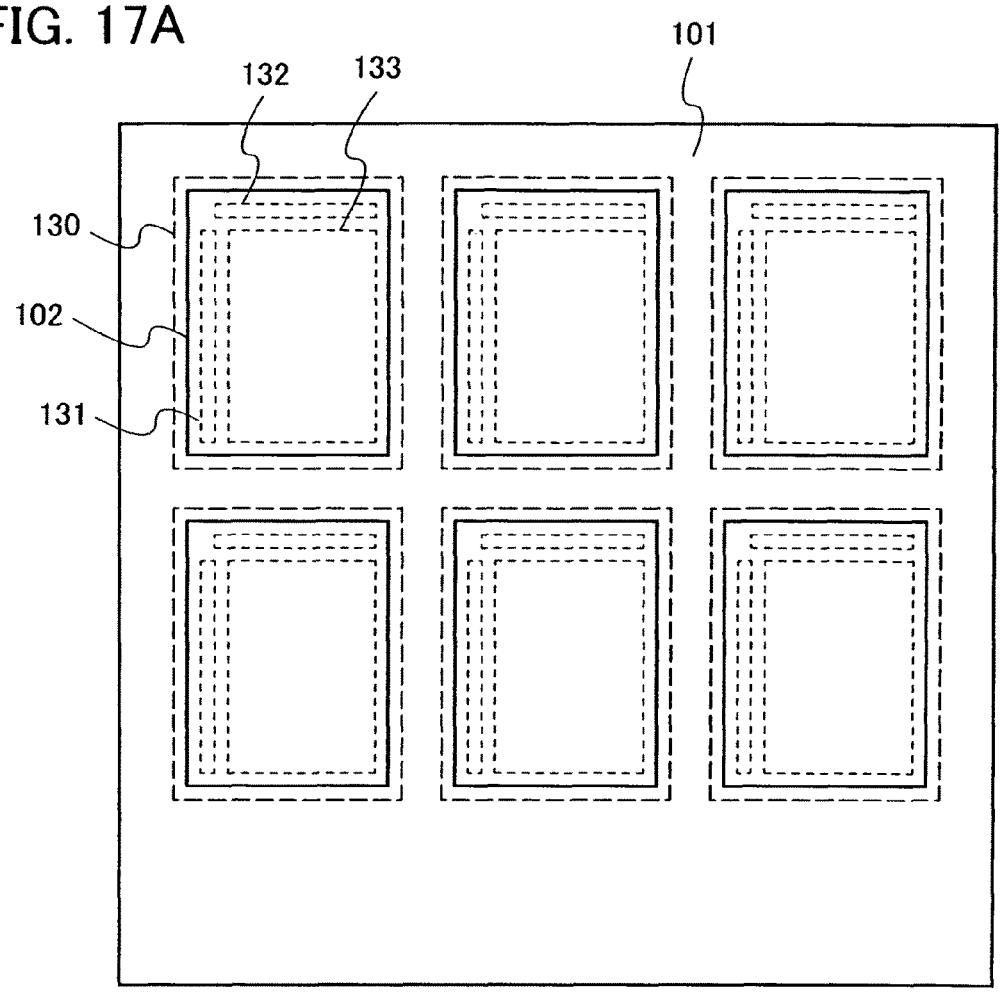
FIGS. 17A and 17B are a plane view and a cross-sectional view, respectively, which show a case as an example, where single-crystal semiconductor layers are bonded to a mother glass for manufacturing a display panel.
Figure 17B:
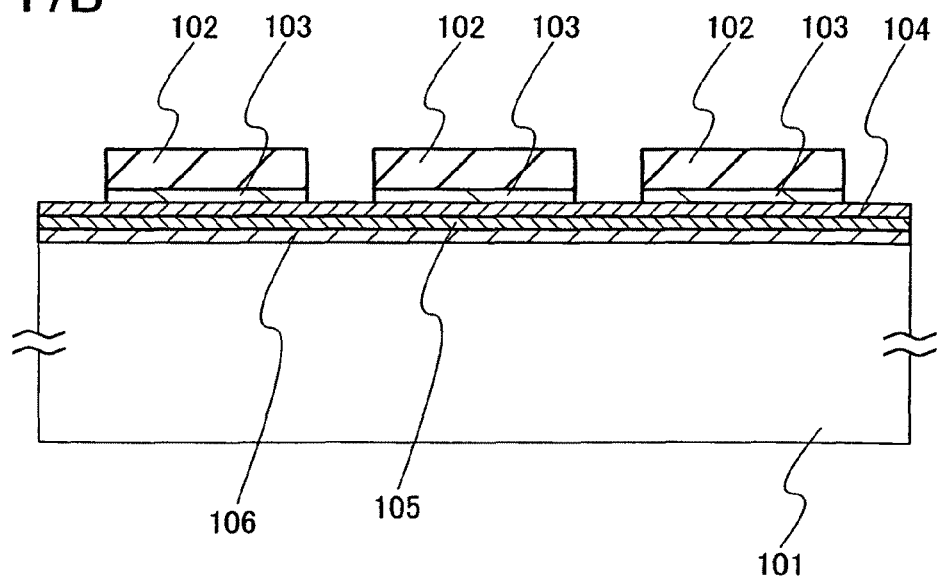

A single-crystal semiconductor layer according to this embodiment mode can be bonded to a large-sized glass substrate called a mother glass used to manufacture a display panel. FIG. 17A shows the case where the single-crystal semiconductor layers 102 are bonded to a mother glass used as the supporting substrate 101. A plurality of display panels is taken out from the mother glass, and the single-crystal semiconductor layers 102 are preferably bonded to match formation regions of display panels 130. Since a mother glass substrate has a larger area than a semiconductor substrate, it is preferable that a plurality of single-crystal semiconductor layers 102 be arranged within the formation regions of the display panels 130 as shown in FIG. 17A. Accordingly, even if the plurality of single-crystal semiconductor layers 102 is arranged over the mother glass serving as the supporting substrate 101, a sufficient space can be provided between adjacent single-crystal semiconductor layers 102. Each of the display panels 130 includes a scan line driver circuit region 131, a signal line driver circuit region 132, and a pixel formation region 133. The single-crystal semiconductor layer 102 is bonded to the mother glass serving as the supporting substrate 101 so as to include these regions. FIG. 17B is a cross-sectional view of FIG. 17A. In the case where a plurality of single-crystal semiconductor layers 102 are bonded to a large-sized glass substrate called a mother glass, there is a possibility that the single-crystal semiconductor layers 102 are contaminated by diffusion of impurities such as sodium from the mother glass serving as the supporting substrate 101. In such a case, the structure as shown in FIG. 1B in which the barrier layer 106 is formed on the supporting substrate 101 side is preferable. When the barrier layer 106 is formed on the entire surface of the supporting substrate 101, diffusion of impurities from the base side into the single-crystal semiconductor layers 102 can be prevented. This structure is suitable for the case of manufacturing a medium or small sized display panel. Alternatively, the structure shown in FIG. 2A may be employed similarly.

Figure 18A:
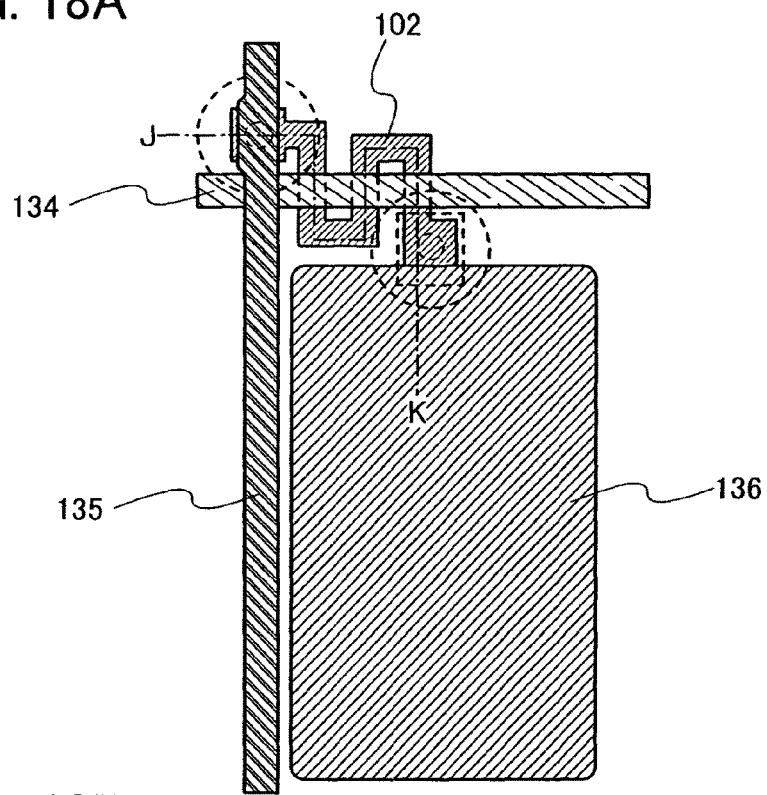
FIGS. 18A and 18B show an example of a liquid crystal display device in which a transistor of a pixel portion is formed using a single-crystal semiconductor layer.
Figure 18B:
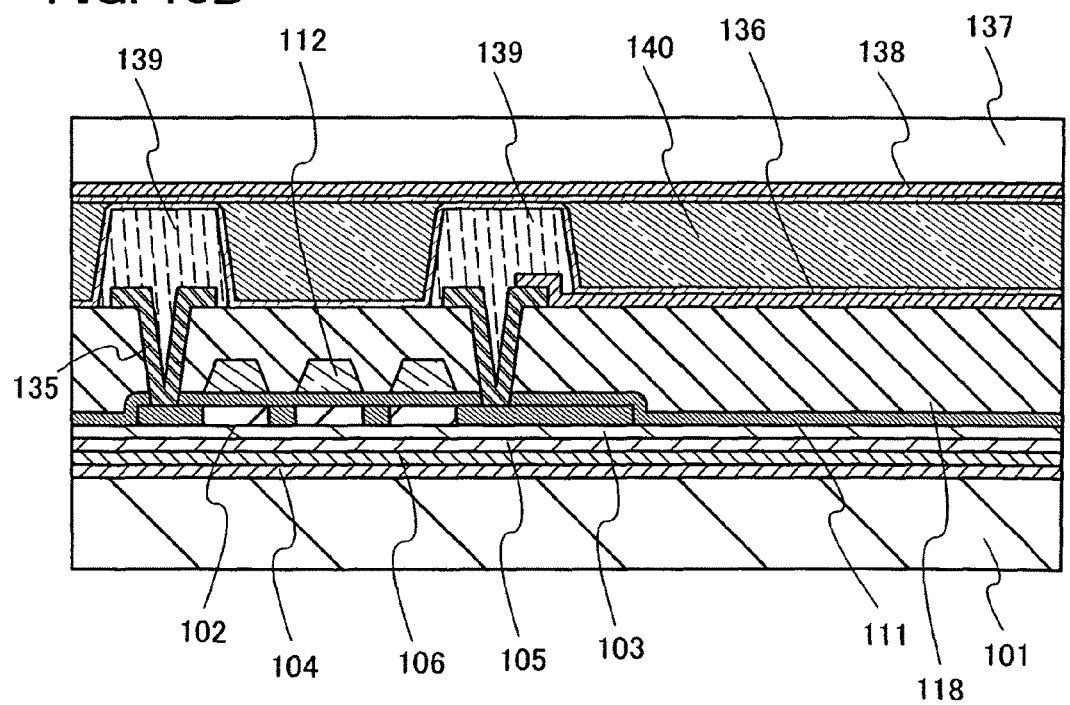

FIGS. 18A and 18B show an example of a pixel of a liquid crystal display device in which a transistor in a pixel portion is formed using a single-crystal semiconductor layer. FIG. 18A is a plane view of the pixel. The single-crystal semiconductor layer intersects with a scanning line 134, and a signal line 135 and a pixel electrode 136 are connected to the single-crystal semiconductor layer. FIG. 18B is a cross-sectional view taken along a line J-K of FIG. 18A.

In FIG. 18B, there is a region having a structure in which the bonding layer 104, the barrier layer 106, the relief layer 105, the insulating layer 103 including a halogen, and the single-crystal semiconductor layer 102 are stacked over the supporting substrate 101, and a transistor of a pixel portion is formed including such a region. The structure of the bonding layer 104, the barrier layer 106, the relief layer 105, the insulating layer 103 including a halogen, and the like is not limited to this, and another structure shown in any of FIGS. 1A to 2B may be employed.

The pixel electrode 136 is provided over the interlayer insulating layer 118. The signal line 135 which is electrically connected to the single-crystal semiconductor layer 102 is formed in a contact hole. Since the contact hole is formed by etching the interlayer insulating layer 118, a step difference is generated. In order to cover this step difference, a columnar spacer 139 is provided. A counter electrode 138 is formed on a counter substrate 137, and a liquid crystal layer 140 is formed in a space formed by the columnar spacer 139.

Figure 19A:
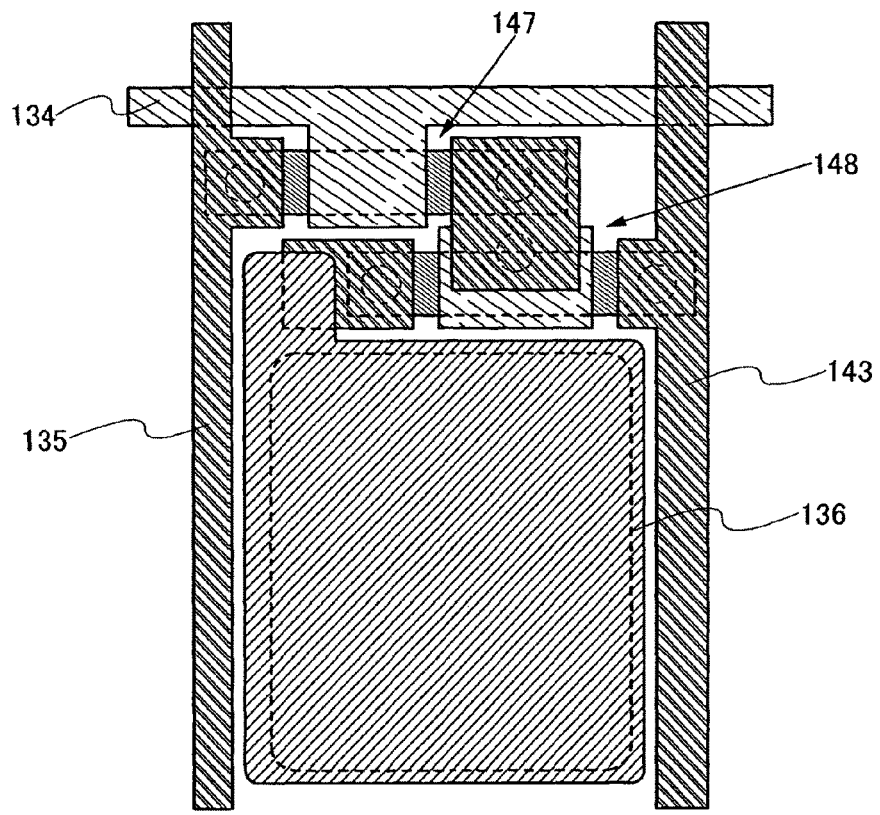
FIGS. 19A and 19B show an example of an electroluminescent display device in which a transistor of a pixel portion is formed using a single-crystal semiconductor layer.
Figure 19B:
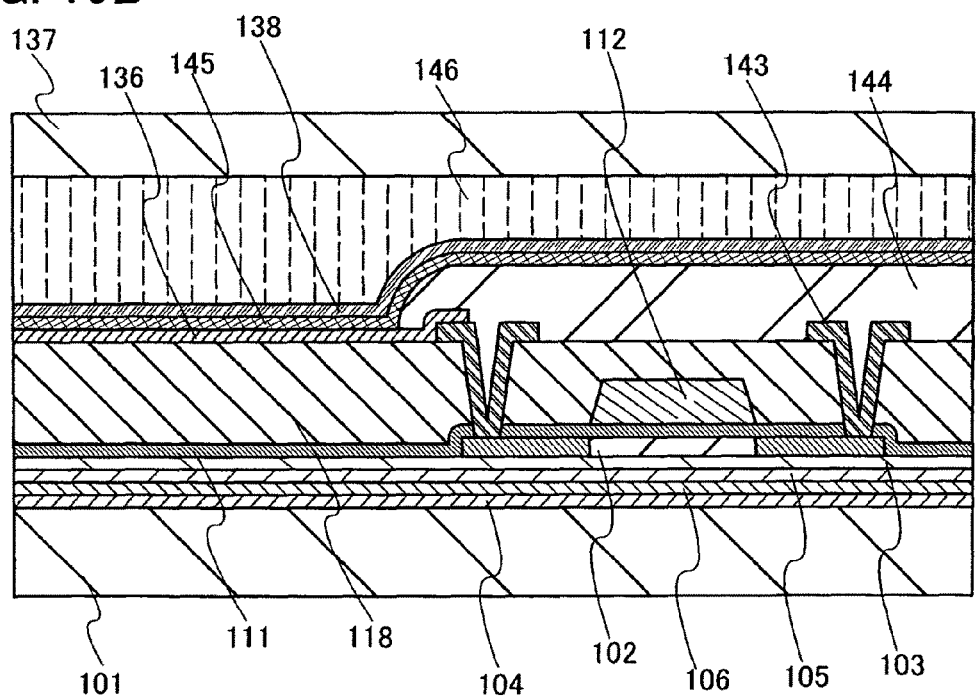

FIG. 19A shows an example of an electroluminescent display device in which a transistor of a pixel portion is formed using a single-crystal semiconductor layer. FIG. 19A is a plane view of the pixel, which has a selection transistor 147 which is electrically connected to a signal line 135 and a display control transistor 148 which is electrically connected to a power supply line 143. This display device has a structure in which each pixel is provided with a light-emitting element that has a layer (EL layer) formed to contain an electroluminescent material between electrodes. A pixel electrode 136 is electrically connected to the display control transistor 148. FIG. 19B is a cross-sectional view showing such a pixel.

In FIG. 19B, there is a region having a structure in which the bonding layer 104, the barrier layer 106, the relief layer 105, the insulating layer 103 including a halogen, and the single-crystal semiconductor layer 102 are stacked over the supporting substrate 101, and the selection transistor 147 and the display control transistor 148 are formed to include such a region. The structure of the bonding layer 104, the barrier layer 106, the relief layer 105, the insulating layer 103 including a halogen, and the like is not limited to this, and another structure shown in any of FIGS. 1A to 2B can be employed. A peripheral portion of the pixel electrode 136 is surrounded by an insulating partition layer 144. Over the pixel electrode 136, an EL layer 145 is formed. Over the EL layer 145, a counter electrode 138 is formed. A light-emitting element is formed of the pixel electrode 136, the EL layer 145, and the counter electrode 138. The pixel portion is filled with a sealing resin 146 and is provided with a counter substrate 137 as a reinforcing plate.

In the electroluminescent display device of this embodiment mode, such pixels are arranged in a matrix to form a display screen. In this case, a channel portion of a transistor of a pixel is formed using the single-crystal semiconductor layer 102. Therefore, there are advantages in that characteristics do not vary from transistor to transistor and emission luminance does not vary from pixel to pixel. Therefore, drive with the brightness of a light-emitting element being controlled by a current is easy, and a correction circuit that corrects variation of transistor characteristics is not necessary. Thus, a load on a driver circuit can be reduced. Furthermore, because a light-transmitting substrate can be selected as the supporting substrate 101, a bottom-emission electroluminescent display device which emits light from the supporting substrate 101 side can be formed.

As described above, a single-crystal semiconductor layer can be formed over a mother glass which is used to manufacture a display device, so that a transistor can be formed. The transistor formed using the single-crystal semiconductor layer is superior to an amorphous silicon transistor in electric characteristics such as current drive capability; therefore, the transistor can be downsized. Accordingly, the aperture ratio of a pixel portion in a display panel can be increased. Furthermore, because a microprocessor like the one shown in FIG. 15 can be formed, a display device can be provided with a function of a computer. Moreover, a display which is capable of inputting and outputting data without contact can be manufactured.

A variety of electronic devices can be formed using the present invention. Examples of electronic devices include a video camera a digital camera, a navigation system, a sound reproducing device (a car audio, an audio component, or the like), a computer, a game machine, a portable information terminal (a mobile computer, a cellular phone, a mobile game machine, an electronic book, or the like), an image reproducing device having a recording medium (specifically, a device for reproducing a recording medium such as a digital versatile disc (DVD) and having a display for displaying the reproduced image), and the like.

Figure 20A:
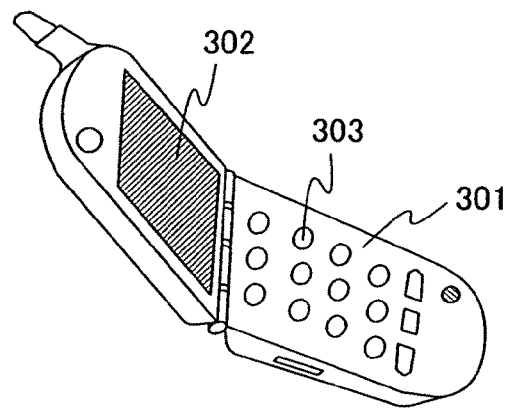
FIGS. 20A to 20C show examples of an electric device according to the present invention.

FIG. 20A shows an example of a cellular phone 301. The cellular phone 301 includes a display portion 302, an operation switch 303, and the like. In the display portion 302, the liquid crystal display device described with reference to FIGS. 18A and 18B or the electroluminescent display device described with reference to FIGS. 19A and 19B can be used. With the use of the display device of this embodiment mode, a display portion with little display unevenness and high image quality can be formed. In addition, any of the semiconductor devices of this embodiment mode can be used for a microprocessor or a memory which is included in the cellular phone 301.

Figure 20B:
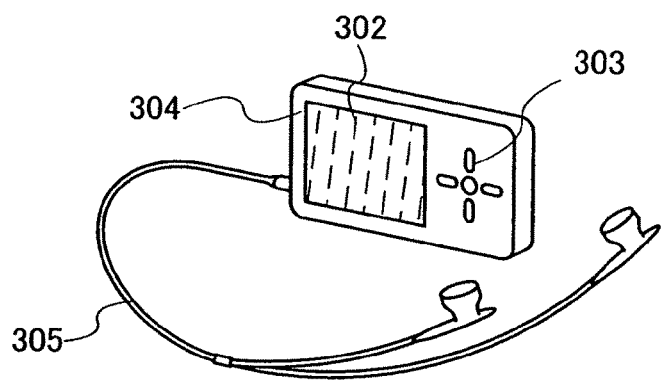

FIG. 20B shows a digital player 304, which is a typical example of an audio device. The digital player 304 shown in FIG. 20B includes a display portion 302, an operation switch 303, earphones 305, and the like. Instead of the earphones 305, headphones or wireless earphones can be used. In the digital player 304, the semiconductor device of this embodiment mode can be used for a memory portion which stores music information or a microprocessor which operates the digital player 304. The digital player 304 having this structure can achieve reduction in size and weight. By application of the liquid crystal display device described with reference to FIGS. 18A and 18B or the electroluminescent display device described with reference to FIGS. 19A and 19B to the display portion 302, the display portion 302 can display an image or textual information with high definition even if it has a screen size of about 0.3 inches to 2 inches.

Figure 20C:
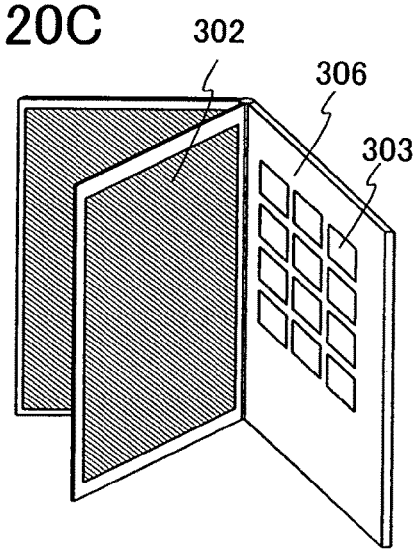

FIG. 20C shows an electronic book 306. This electronic book 306 includes a display portion 302 and an operation switch 303. A modem may be built in, or a structure in which information can be transmitted and received wirelessly may be employed. In the electronic book 306, any of the semiconductor devices of this embodiment mode can be used for a memory portion which stores information or a microprocessor which operates the electronic book 306. In the memory portion, a NOR-type nonvolatile memory with a memory capacity of 20 gigabytes (GB) to 200 gigabytes (GB) can be used, with which images or sounds (music) can be stored and reproduced. By application of the liquid crystal display device described with reference to FIGS. 18A and 18B or the electroluminescent display device described with reference to FIGS. 19A and 19B to the display portion 302, the display portion 302 can perform display with high image quality.

This application is based on Japanese Patent Application serial no. 2007-147388 filed with Japan Patent Office on Jun. 1, 2007, the entire contents of which are hereby incorporated by reference.

What is claimed is:

1. A manufacturing method of a semiconductor substrate comprising steps of:
    forming an insulating layer containing a halogen being in contact with a single-crystal semiconductor substrate;
    forming a relief layer comprising an insulating material over the insulating layer;
    forming a separation layer by introducing ions into the single-crystal semiconductor substrate;
    bonding the single-crystal semiconductor substrate and a supporting substrate with a bonding layer interposed therebetween, wherein the bonding layer is formed over at least one of the single-crystal semiconductor substrate and a surface of the supporting substrate; and
    separating the single-crystal semiconductor substrate from the supporting substrate thereby forming a single-crystal semiconductor layer over the supporting substrate.

2. The manufacturing method of a semiconductor substrate according to claim 1, further comprising a step of forming a barrier layer comprising an insulating material containing nitrogen over the relief layer before forming the separation layer.

3. The manufacturing method of a semiconductor substrate according to claim 1, wherein the single-crystal semiconductor substrate is a single-crystal silicon substrate.

4. The manufacturing method of a semiconductor substrate according to claim 1, wherein the insulating layer is formed by oxidizing a surface of the single-crystal semiconductor substrate.

5. The manufacturing method of a semiconductor substrate according to claim 1, wherein the relief layer includes nitrogen at less than 20 at. % and hydrogen and/or an OH group at 1 at. % to 20 at. %.

6. The manufacturing method of a semiconductor substrate according to claim 1, wherein the separation layer is formed by introducing hydrogen ions or halogen ions.

7. The manufacturing method of a semiconductor substrate according to claim 1, wherein the separation layer is formed by introducing ions accelerated by an electric field.

8. The manufacturing method of a semiconductor substrate according to claim 1, wherein the single-crystal semiconductor substrate is separated from the supporting substrate by heat treatment.

9. A manufacturing method of a semiconductor device comprising steps of:
    forming an insulating layer containing a halogen being in contact with a single-crystal semiconductor substrate;
    forming a relief layer comprising an insulating material over the insulating layer;
    forming a separation layer by introducing ions into the single-crystal semiconductor substrate;
    bonding the single-crystal semiconductor substrate and a supporting substrate with a bonding layer interposed therebetween, wherein the bonding layer is formed over at least one of the single-crystal semiconductor substrate and the supporting substrate;
    separating the single-crystal semiconductor substrate from the supporting substrate thereby forming a single-crystal semiconductor layer over the supporting substrate;
    separating the single-crystal semiconductor layer into island shapes in accordance with arrangement of semiconductor elements;
    forming a gate insulating layer over the single-crystal semiconductor layer after separating the single-crystal semiconductor layer into island shapes;
    forming a gate electrode over the gate insulating layer;
    forming an interlayer insulating layer over the gate electrode;
    forming a contact hole in the interlayer insulating layer; and
    forming a wiring in the contact hole.

10. The manufacturing method of a semiconductor device according to claim 9, further comprising a step of forming a barrier layer comprising an insulating material containing nitrogen over the relief layer before forming the separation layer.

11. The manufacturing method of a semiconductor device according to claim 9, further comprising a step of forming a protective film after forming the gate electrode.

12. The manufacturing method of a semiconductor device according to claim 9, wherein the single-crystal semiconductor substrate is a single-crystal silicon substrate.

13. The manufacturing method of a semiconductor device according to claim 9, wherein the insulating layer is formed by oxidizing a surface of the single-crystal semiconductor substrate.

14. The manufacturing method of a semiconductor device according to claim 9, wherein the relief layer includes nitrogen at less than 20 at. % and hydrogen and/or an OH group at 1 at. % to 20 at. %.

15. The manufacturing method of a semiconductor device according to claim 9, wherein the separation layer is formed by introducing hydrogen ions or halogen ions.

16. The manufacturing method of a semiconductor device according to claim 9, wherein the gate insulating layer is formed by supplying a nitrogen oxide gas, and a silicon hydride gas or a silicon fluoride gas by a microwave plasma chemical vapor deposition method to include oxygen, nitrogen, silicon, and hydrogen and/or an OH group at 55 at. % to 65 at. %, 1 at. % to 20 at. %, 25 at. % to 35 at. %, and 0.1 at. % to 10 at. %, respectively when the total content of oxygen, nitrogen, silicon, and hydrogen is defined as 100 at.

17. The manufacturing method of a semiconductor device according to claim 9, wherein the separation layer is formed by introducing ions accelerated by an electric field.

18. The manufacturing method of a semiconductor device according to claim 9, wherein the single-crystal semiconductor substrate is separated from the supporting substrate by heat treatment.

19. A manufacturing method of a semiconductor device comprising steps of:

forming a single-crystal semiconductor layer over a supporting substrate having an insulating surface; and forming a silicon oxynitride layer in contact with the single-crystal semiconductor layer, wherein the silicon oxynitride layer is formed by supplying a nitrogen oxide gas, and a silicon hydride gas or a silicon fluoride gas by a microwave plasma chemical vapor deposition method to include oxygen, nitrogen, silicon, and hydrogen and/or an OH group at 55 at. % to 65 at. %, 1 at. % to 20 at. %, 25 at. % to 35 at. %, and 0.1 at. % to 10 at. %, respectively when the total content of oxygen, nitrogen, silicon, and hydrogen is defined as 100 at. %.

20. The manufacturing method of a semiconductor device according to claim 19, wherein the silicon hydride gas is $SiH_4$ and the nitrogen oxide gas is $N_2O$.

21. The manufacturing method of a semiconductor device according to claim 19, further comprising a step of forming a gate electrode in contact with the silicon oxynitride layer.

* * * * *

UNITED STATES PATENT AND TRADEMARK OFFICE
CERTIFICATE OF CORRECTION

PATENT NO. : 7,989,273 B2  Page 1 of 1
APPLICATION NO. : 12/155052
DATED : August 2, 2011
INVENTOR(S) : Shunpei Yamazaki et al.

It is certified that error appears in the above-identified patent and that said Letters Patent is hereby corrected as shown below:

At column 23, line 56, please delete "a surface of".

Signed and Sealed this
Fifteenth Day of November, 2011

David J. Kappos
*Director of the United States Patent and Trademark Office*